United States Patent
Hermes et al.

(10) Patent No.: US 11,908,956 B2
(45) Date of Patent: Feb. 20, 2024

(54) OPTICAL SENSOR AND DETECTOR FOR AN OPTICAL DETECTION

(71) Applicant: trinamix GmbH, Ludwigshafen am Rhein (DE)

(72) Inventors: Wilfried Hermes, Ludwigshafen (DE); Sebastian Valouch, Ludwigshafen (DE); Sebastian Mueller, Ludwigshafen (DE); Regina Hoeh, Ludwigshafen (DE); Heidi Bechtel, Ludwigshafen (DE); Timo Altenbeck, Ludwigshafen (DE); Fabian Dittmann, Ludwigshafen (DE); Bertram Feuerstein, Ludwigshafen (DE); Thomas Hupfauer, Ludwigshafen (DE); Anke Handreck, Ludwigshafen (DE); Robert Gust, Ludwigshafen (DE); Peter Paul Kaletta, Ludwigshafen (DE); Daniel Kaelblein, Ludwigshafen (DE); Robert Send, Ludwigshafen (DE)

(73) Assignee: TRINAMIX GMBH, Ludwigshafen am Rhein (DE)

( * ) Notice: Subject to any disclaimer, the term of this patent is extended or adjusted under 35 U.S.C. 154(b) by 425 days.

(21) Appl. No.: 17/434,568

(22) PCT Filed: Feb. 26, 2020

(86) PCT No.: PCT/EP2020/054995
§ 371 (c)(1),
(2) Date: Aug. 27, 2021

(87) PCT Pub. No.: WO2020/173985
PCT Pub. Date: Sep. 3, 2020

(65) Prior Publication Data
US 2022/0140155 A1    May 5, 2022

(30) Foreign Application Priority Data

Feb. 27, 2019 (EP) .................... 19159710

(51) Int. Cl.
*H01L 31/02* (2006.01)
*H01L 31/0224* (2006.01)
*H01L 31/09* (2006.01)

(52) U.S. Cl.
CPC .... *H01L 31/02005* (2013.01); *H01L 31/0224* (2013.01); *H01L 31/09* (2013.01)

(58) Field of Classification Search
CPC .......... H01L 31/02005; H01L 31/0224; H01L 31/09
See application file for complete search history.

(56) References Cited

U.S. PATENT DOCUMENTS 4,037,311 A * 7/1977 Blackman ............... H01L 31/09
                                                                257/E31.093
2007/0113886 A1   5/2007 Arao et al.

FOREIGN PATENT DOCUMENTS

EP    0036780 A2   9/1981
EP    1906459 A2   4/2008
(Continued)

OTHER PUBLICATIONS

International Search Report and Written Opinion for corresponding PCT/EP2020/054995 dated Jun. 24, 2020, 16 Pages.
(Continued)

*Primary Examiner* — Suberr L Chi
(74) *Attorney, Agent, or Firm* — Armstrong Teasdale LLP

(57) ABSTRACT

Described herein is an optical sensor, a detector including the optical sensor for an optical detection of at least one object, and a method for manufacturing the optical sensor. The optical sensor (110) includes
a substrate (120);

(Continued)

a photoconductive layer (112) applied to a first portion (116) of a surface (118) of the substrate (120); and at least one electrode layer (124) applied to a second portion (126) of the surface (118) of the substrate (120). The optical sensor (110) exhibits a linear current-voltage characteristic according to Ohm's law.

16 Claims, 5 Drawing Sheets

(56) References Cited

FOREIGN PATENT DOCUMENTS

| | | |
|---|---|---|
| JP | S57124467 A | 8/1982 |
| JP | 660241260 A | 11/1985 |
| JP | H0394468 A | 4/1991 |
| WO | 2012110924 A1 | 8/2012 |
| WO | 2014097181 A1 | 6/2014 |
| WO | 2016120392 A1 | 8/2016 |
| WO | 2018019921 A1 | 2/2018 |
| WO | 2020148381 A1 | 7/2020 |

OTHER PUBLICATIONS

"Printed circuit board", Wikipedia, available at <https://en.wikipedia.org/wiki/Printed_circuit_board>.

"List of integrated circuit packaging types", Wikipedia, available at <https://en.wikipedia.org/wiki/List_of_integrated_circuit_packaging_types>.

"List of integrated circuit package dimensions", Wikipedia, available at <https://en.wikipedia.org/wiki/List_of_integrated_circuit_package_dimensions>.

European Search Report for corresponding application EP19159710.3, dated Sep. 16, 2019, 13 pages.

\* cited by examiner

OPTICAL SENSOR AND DETECTOR FOR AN OPTICAL DETECTION

CROSS-REFERENCE TO RELATED APPLICATIONS

This application is a U.S. National Phase Application of International Patent Application No. PCT/EP2020/054995, filed Feb. 26, 2020, which claims priority to European Patent Application No. 19159710.3, filed Feb. 27, 2019, the entire contents of which are hereby incorporated by reference herein.

FIELD OF THE INVENTION

The invention relates to an optical sensor and to a detector comprising such an optical sensor for an optical detection, in particular of optical radiation, especially within the infrared spectral range, specifically with regard to sensing at least one of transmissivity, absorption, emission and reflectance, provided by at least one light beam, or for determining a position of at least one object, specifically with regard to a depth or both to the depth and a width of the at least one object. Further, the invention relates to a method for manufacturing the optical sensor and to various uses of the optical sensor and the detector. Such devices, methods and uses can be employed in various areas of security technology. However, further applications are possible.

PRIOR ART

Various detectors for optically detecting at least one object are known on the basis of optical sensors.

WO 2012/110924 A1 discloses a detector comprising at least one optical sensor, wherein the optical sensor exhibits at least one sensor region. Herein, the optical sensor is designed to generate at least one sensor signal in a manner dependent on an illumination of the sensor region. According to the FiP effect as described therein, the sensor signal, given the same total power of the illumination, is hereby dependent on a geometry of the illumination, in particular on a beam cross-section of the illumination on the sensor region. The detector furthermore has at least one evaluation device designated to generate at least one item of geometrical information from the sensor signal, in particular at least one item of geometrical information about the illumination and/or the object.

WO 2014/097181 A1 discloses a method and a detector for determining a position of at least one object, by using at least one transversal optical sensor and at least one longitudinal optical sensor. Preferably, a stack of longitudinal optical sensors is employed, in particular to determine a longitudinal position of the object with a high degree of accuracy and without ambiguity. Further, WO 2014/097181 A1 discloses a human-machine interface, an entertainment device, a tracking system, and a camera, each comprising at least one such detector for determining a position of at least one object.

WO 2016/120392 A1 discloses further kinds of materials which are suitable as longitudinal optical sensor. Herein, a sensor region of the longitudinal optical sensor comprises a photoconductive material, wherein an electrical conductivity in the photoconductive material, given the same total power of the illumination, is dependent on the beam cross-section of the light beam in the sensor region. Thus, the longitudinal sensor signal is dependent on the electrical conductivity of the photoconductive material. Preferably, the photoconductive material is selected from lead sulfide (PbS), lead selenide (PbSe), lead telluride (PbTe), cadmium telluride (CdTe), indium phosphide (InP), cadmium sulfide (CdS), cadmium selenide (CdSe), indium antimonide (InSb), mercury cadmium telluride (HgCdTe; MCT), copper indium sulfide (CIS), copper indium gallium selenide (CIGS), zinc sulfide (ZnS), zinc selenide (ZnSe), or copper zinc tin sulfide (CZTS). Further, solid solutions and/or doped variants thereof are also feasible. Further, a transversal optical sensor having a sensor area is disclosed, wherein the sensor area comprises a layer of the photo-conductive material, preferentially embedded in between two layers of a transparent conducting oxide, and at least two electrodes. Preferably, at least one of the electrodes is a split electrode having at least two partial electrodes, wherein transversal sensor signals provided by the partial electrodes indicate an x- and/or a y-position of the incident light beam within the sensor area.

Accordingly, a photoconductive sensor which comprises a photoconductive material can be used as a photoresistor. Herein, a resistive behavior of the photoresistor can be measured by observing a change of an electrical resistance of the photoresistor upon a change of an illumination of the photoconductive material. Being a resistor, the photoresistor is supposed to obey Ohm's law at a given illumination including zero illumination, i.e. in the dark. As generally known, Ohm's law describes a linear current-voltage characteristic $$V \sim I$$

between an applied voltage V and a resulting current I or between an applied current I and a resulting voltage V in an electrical resistor such that the resistive behavior of the photoresistor is symmetric with respect to inverting the applied voltage and the applied current. However, depending on the actual layout of an electrode-photoconductor interface of an electrode layer being located adjacently to the photoconductive material, it can be observed that the resistive behavior of the photoconductor deviates from the linear current-voltage characteristic according to Ohm's law.

JP S60 241260 A discloses a solid-state imaging device using an amorphous Si layer formed on a solid-state scanning device as a photoelectric conversion unit. To increase the uniformity in quality of the amorphous Si layer, a product of an angle of inclination of the end of an electrode in contact to the amorphous Si layer with the film thickness of said electrode is not more than 10 μm×degree under sufficient inclination of the end of the electrode.

US 2007/113886 A1 discloses a photoelectric conversion device having a photoelectric conversion layer between a first electrode and a second electrode. Herein, the first electrode is partially in contact with the photoelectric conversion layer, and a cross-sectional shape of the first electrode in the contact portion is a taper shape, wherein a part of a first semiconductor layer with one conductivity type is in contact with the first electrode. A shape in an edge portion of the first electrode is preferably non-angular, i.e. a shape in which edges are plane or have a curved shape. As a result, a concentration of an electric field and of stress can be suppressed, thereby reducing a characteristic deterioration of the photoelectric conversion device. As particularly discloses herein, Ti can be used for the electrode which may be formed of a single layer film or a stacked layer film.

JP S57 124467 A discloses a layer insulating film which coats a drain electrode on a silicon substrate by heat-resisting resin and flattening the surface. Further, an electrode is provided for connection, wherein the electrode has ohmic contacts with a source electrode on the silicon substrate and extends onto the insulating film. Further, a photoconductive film is shaped onto the electrode for connection through evaporation. This setup intend to inhibit dark currents.

EP 1 906 459 A2 discloses a metal layer stack of a bonding layer of Ti, a charge carrier of Au and an intermediate layer of Ni.

WO 2018/019921 A1 discloses an optical sensor comprising a layer of at least one photoconductive material, at least two individual electrical contacts contacting the layer of the photoconductive material, and a cover layer deposited on the layer of the photoconductive material, wherein the cover layer is an amorphous layer comprising at least one metal-containing compound. The optical sensor can be supplied as a non-bulky hermetic package which, nevertheless, provides a high degree of protection against possible degradation by humidity and/or oxygen. Moreover, the cover layer is capable of activating the photoconductive material which results in an increased performance of the optical sensor. Further, the optical sensor may be easily manufactured and integrated on a circuit carrier device.

In addition, European patent application 19 152 511.2, filed Jan. 18, 2019, discloses an optical sensor which comprises a substrate, a layer of at least one photoconductive material which is directly or indirectly applied to the substrate, at least two individual electrical contacts contacting the layer of the photoconductive material, and a cover covering accessible surfaces of the photoconductive material and of the substrate, wherein the cover is an amorphous cover which comprises at least one metal-containing compound.

Despite the advantages implied by the above-mentioned devices and detectors, there still is a need for improvements with respect to a simple, cost-efficient and, still, reliable optical sensor and spatial detector.

Problem Addressed by the Invention

Therefore, a problem addressed by the present invention is that of specifying a device and a method for an optical detection which at least substantially avoids the disadvantages of known devices and methods of this type.

In particular, providing an improved simple, cost-efficient and, still, reliable optical sensor and detector for detecting optical radiation, especially within the infrared spectral range, would be desirable, specifically with regard to sensing at least one of transmissivity, absorption, emission and reflectance or for determining a position of at least one object, specifically with regard to a depth or both to the depth and a width of the at least one object.

More particular, it would be desirable to provide an optical sensor exhibiting a linear current-voltage characteristic which is, in addition, symmetric with respect to inverting the applied voltage V and the applied current I, such that a deviation from Ohm's law is avoided as far as possible.

SUMMARY OF THE INVENTION

This problem is solved by the invention with the features of the independent patent claims. Advantageous developments of the invention, which can be realized individually or in combination, are presented in the dependent claims and/or in the following specification and detailed embodiments.

As used herein, the expressions "have", "comprise" and "contain" as well as grammatical variations thereof are used in a non-exclusive way. Thus, the expression "A has B" as well as the expression "A comprises B" or "A contains B" may both refer to the fact that, besides B, A contains one or more further components and/or constituents, and to the case in which, besides B, no other components, constituents or elements are present in A.

In a first aspect of the present invention, an optical sensor is disclosed. Herein, the optical sensor according to the present invention comprises a substrate;
a photoconductive layer applied to a first portion of a surface of the substrate, the photoconductive layer having at least one photoconductive material;
at least one electrode layer applied to a second portion of the surface of the substrate, wherein the electrode layer, apart from a first edge portion of the electrode layer, exhibits a thickness $d_0$, wherein the first edge portion of the electrode layer is covered by an edge portion of the photoconductive layer in a manner that an electrode-photoconductor interface is formed at a surface of the electrode layer, wherein the electrode-photoconductor interface comprises a first segment, a second segment, and a third segment;
wherein a thickness $d_1$ of the electrode layer along the electrode-photoconductor interface within the first segment equals the thickness $d_0$ of the electrode layer;
wherein a thickness $d_2$ of the electrode layer along the electrode-photoconductor interface within the second segment is equal to or exceeds the thickness $d_0$ of the electrode layer; and
wherein a thickness $d_3$ of the electrode layer along the electrode-photoconductor interface within the third segment decreases continuously and monotonically along the electrode-photoconductor interface within the third segment towards an edge of the electrode layer.

As used herein, the "optical sensor" is generally a device which is designed to generate at least one sensor signal in a manner dependent on an illumination of a sensor region by a light beam. The sensor signal may generally be an arbitrary signal indicative of at least one of transmissivity, absorption, emission and reflectance of an incident light beam illuminating the sensor region, wherein the incident light beam may be provided by an object. As an example, the sensor signal may be or may comprise a digital and/or an analog signal. As an example, the sensor signal may be or may comprise a voltage signal and/or a current signal. Additionally or alternatively, the sensor signal may be or may comprise digital data. The sensor signal may comprise a single signal value and/or a series of signal values. The sensor signal may further comprise an arbitrary signal which is derived by combining two or more individual signals, such as by averaging two or more signals and/or by forming a quotient of two or more signals.

The "object" generally may be an arbitrary object, chosen from a living object and a non-living object. Thus, as an example, the at least one object may comprise one or more articles and/or one or more parts of an article. Additionally or alternatively, the object may be or may comprise one or more living beings and/or one or more parts thereof, such as one or more body parts of a human being, e.g. a user, and/or an animal.

As used herein, a "position" generally refers to an arbitrary item of information on a location and/or orientation of the object in space. For this purpose, as an example, one or more coordinate systems may be used, and the position of the object may be determined by using one, two, three or more coordinates. Herein, a first coordinate may refer to a depth of an object which refers to a distance between the optical sensor and the object while two other coordinates which may be perpendicular to the first coordinate may refer to a width of the object. As an example, one or more Cartesian coordinate systems and/or other types of coordinate systems may be used. In one example, the coordinate system may be a coordinate system of the detector in which the detector has a predetermined position and/or orientation.

According to the present invention, the optical sensor comprises a photoconductive layer having at least one photoconductive material, wherein the photoconductive layer may function as a sensor region. As generally used, the term "layer" refers to an elongated body which comprises two extended surfaces between which sides are arranged. As used herein, the "sensor region" is considered as a partition of the optical sensor being designed to receive the illumination of the optical sensor by the light beam, wherein the illumination in a manner as received by the sensor region may trigger the generation of the at least one sensor signal, wherein the generation of the sensor signal may be governed by a defined relationship between the sensor signal and the manner of the illumination of the sensor region. According to the present invention, the sensor region is formed by the photoconductive layer or a partition thereof. In a particular embodiment, the photoconductive layer may comprise at least two individual sensor areas, preferably an array of individual sensor areas, which are directly or indirectly applied to the same substrate, also denoted as "common substrate", which may, thus, exhibit a considerably large area.

As used herein, the term "photoconductive material" refers to a material which is capable of sustaining an electrical current and, therefore, exhibits a specific electrical conductivity, wherein, specifically, the electrical conductivity is dependent on the illumination of the material. Since an electrical resistivity is defined as the reciprocal value of the electrical conductivity, alternatively, the term "photoresistive material" may also be used to denominate the same kind of material. For the purposes of the present invention, the photoconductive material as used in the sensor region of the optical sensor may, preferably, comprise an inorganic photoconductive material, and/or a solid solution thereof and/or a doped variant thereof. As used herein, the term "solid solution" refers to a state of the photoconductive material in which at least one solute may be comprised in a solvent, whereby a homogeneous phase is formed and wherein the crystal structure of the solvent may, generally, be unaltered by the presence of the solute. By way of example, the binary PbSe may be solved in PbS leading to $PbSi_{1-x}Se_x$, wherein x can vary from 0 to 1. As further used herein, the term "doped variant" may refer to a state of the photoconductive material in which single atoms apart from the constituents of the material itself are introduced onto sites within the crystal which are occupied by intrinsic atoms in the undoped state.

In this regard, the inorganic photoconductive material may, in particular, comprise one or more of selenium, tellurium, a selenium-tellurium alloy, a metal oxide, a group IV element or compound, i.e. an element from group IV or a chemical compound with at least one group IV element, a group III-V compound, i.e. a chemical compound with at least one group III element and at least one group V element, a group II-VI compound, i.e. a chemical compound with, on one hand, at least one group II element or at least one group XII element and, on the other hand, at least one group VI element, and/or a chalcogenide, which might, preferably, be selected from a group comprising sulfide chalcogenides, selenide chalcogenides, ternary chalcogenides, quaternary and higher chalcogenides. As generally used, the term "chalcogenide" refers to a compound which may comprise a group 16 element of the periodic table apart from an oxide, i.e. a sulfide, a selenide, and a telluride. Further, the term "chalcogenide" may also refer to mixed chalcogenides such as sulfoxides, sulfoselenides, selenidotellurides or the like. However, other inorganic photoconductive materials may equally be appropriate.

In a particularly preferred embodiment of the present invention, the at least one photoconductive material may comprise a sulfide chalcogenide, preferably lead sulfide (PbS), a selenide chalcogenide, preferably lead selenide (PbSe), a ternary chalcogenide, preferably lead sulfoselenide (PbSSe), or another appropriate material. Since at least the mentioned preferred photoconductive materials are, generally, known to exhibit a distinctive absorption characteristic within the infrared spectral range, the optical sensor having the layer which comprises the mentioned preferred photoconductive material may, preferably, be used as an infrared sensor. However, other embodiments and/or other photoconductive materials, in particular the photoconductive materials as disclosed in WO 2018/019921 A1 may also be feasible.

With regard to the mentioned photoconductive materials, layers of those materials which may comprise at least a few crystals exhibiting a size above 15 nm are included. Herein, the photoconductive layer photoconductive may be fabricated by applying at least one deposition method which may be selected from the group consisting of: vacuum evaporation, sputtering, atomic layer deposition, chemical vapor deposition, spray pyrolysis, electrodeposition, anodization, electro-conversion, electro-less dip growth, successive ionic adsorption and reaction, chemical bath deposition, and solution-gas interface techniques. As a result, the photoconductive layer may exhibit a thickness of 10 nm to 100 µm, preferably of 100 nm to 10 µm, more preferred of 300 nm to 5 µm. However other photoconductive materials as mentioned above and/or below may also be feasible for this purpose and may also be treated in the same or in a similar fashion.

Preferably, the photoconductive material may be fabricated by depositing the respective material on a first portion of the surface of the substrate as described below in more detail, in particular for providing mechanical stability to the photoconductive layer. In this manner, by depositing the selected layer on the appropriate substrate and providing at least two electrical contacts, wherein at least one, preferably all, of the electrical contacts may be provided as an electrode layer as described herein, the optical sensor according to the present invention can, thus, be obtained. Herein, an illumination of the photoconductive material in the sensor region by an incident light beam results in a variation of the electrical conductivity in the illuminated layer of the photoconductive material. In a particular embodiment, the substrate may be or comprise an electrically conducting substrate, wherein an additional insulating interlayer may be present between the electrically conducting substrate and the at least one layer of the photoconductive material.

As indicated above, the individual electrical contacts may be applied at the electrode layer, especially, in a manner that two of the individual electrical contacts are electrically isolated with respect to each other. According to the present invention, any or, preferably, all of the electrical contacts comprise an electrode layer as described below in more detail. Accordingly, the least one electrode layer is applied to a second portion of the surface of the substrate while, as already indicated above, the photoconductive layer is deposited on the first portion of the surface of the substrate. As used herein, the term "portion" refers to an arbitrary part of the surface of the substrate, wherein the terms "first" and "second" are only intended to distinguish the respective portions from each other. Further according to the present invention, the electrode layer and the photoconductive layer are provided in a fashion that a first edge portion of the electrode layer is covered by an edge portion of the photoconductive layer, whereby an electrode-photoconductor interface is formed at a surface of the electrode layer. As described below in more detail, the electrode layer, in addition, comprises a second edge portion, wherein the second edge portion is not covered by the photoconductive layer, thus allowing one or more electrical contacts to be applied to the electrode layer, wherein the at least one electrical contact can be used for providing electrical connection to an external circuit via one or more leads. As generally used, the term "edge portion" refers to a terminating portion of the corresponding layer. Consequently, the first edge portion and the second edge portion of the electrode layer may, preferably, be placed at locations in the electrode layer which are located apart from each other, such as on opposing sides of the electrode layer.

Further, the electrode layer is provided in a manner that it exhibits a thickness $d_0$, in particular a uniform thickness which extends over the complete electrode layer apart from the first edge portion of the electrode layer as described below in more detail. In a preferred embodiment, the thickness $d_0$ of the electrode layer may be of 5 nm, preferably of 10 nm, more preferred of 20 nm, most preferred of 25 nm, to 1000 nm, preferably to 500 nm, more preferred to 250 nm, most preferred 200 nm. As generally used, the term "thickness" of a layer refers to a value that can be assigned to a diameter generally perpendicular with regard to the two extended surfaces of the layer as defined above. In general, a measured value for the thickness can, preferably, be obtained by applying an optical investigation method and device, such as high-resolution light microscopy, to generate an image of a profile of a sample of the optical sensor, wherefrom the value for the diameter being perpendicular to the two extended surfaces of the layer can be determined. However, other investigation methods and devices may also be feasible.

As already mentioned above, an electrode-photoconductor interface is formed at a surface of the electrode layer which adjoins the edge portion of the photoconductive layer that covers the electrode layer. As generally used, the term "interface" refers to a boundary which automatically develops between two adjacent layers. In this respect, it is emphasized that the electrode-photoconductor interface herein refers to the surface of the electrode layer which, preferably as an evaporated metallic layer, exhibits, as demonstrated below, a well-defined surface, specifically in contrast to the surface of the photoconductive layer which, preferably as a crystalline semiconductor, might exhibit a less well-defined surface which may comprise pinholes and porous structures, such as between crystals. Consequently, all features related to the electrode-photoconductor interface relate, unless otherwise indicated, to the surface of the electrode layer adjoining the edge portion of the photoconductive layer covering the electrode layer. Based on this consideration, the electrode-photoconductor interface comprises a first segment, a second segment, and a third segment, wherein the second segment adjoins the first segment, and wherein the third segment adjoins the second segment. As generally used, the term "segment" herein refers to a partition of the surface of the electrode layer which adjoins the edge portion of the photoconductive layer covering the electrode layer. Consequently, the partition of the surface of the electrode layer which is covered by the edge portion of the photoconductive layer is divided into three individual partitions which are consecutively arranged along the electrode-photoconductor. As further generally used, the terms "adjoins" or "adjoining" refer to an arrangement of two layers as defined above in which opposing sides of the two layers abut each other. For further details, reference may be made to the Figures and their respective description below.

Firstly, the first segment adjoins that partition of the surface of the electrode layer which is not covered by the edge portion of the photoconductive layer. Herein, a thickness $d_1$ of the electrode layer along the electrode-photoconductor interface within the first segment is not changed such that the thickness $d_1$ of the electrode layer within the first segment equals the thickness $d_0$ of the electrode layer. As generally used herein, the term "equals" refers to assuming the same value within 10%, preferably within 5%, more preferred with 3%.

Further, the second segment adjoins the first segment. Herein, a thickness $d_2$ of the electrode layer along the electrode-photoconductor interface within the second segment may be equal to the thickness $d_0$ of the electrode layer or may, preferably, exceed the thickness $d_0$ of the electrode layer. Again, the term "equals" refers also here to assuming the same value within 10%, preferably within 5%, more preferred with 3%. In a particularly preferred embodiment, a maximum elevation $h=d_2-d_0$ of the electrode layer along the electrode-photoconductor interface within the second segment with respect to the thickness $d_0$ of the electrode layer may, however, preferably exceed the thickness $d_0$ of the electrode layer by not more than 27%, more preferred by not more than 17%, most preferred by not more than 7%.

Further, the third segment adjoins the second segment and extends towards an edge of the electrode layer in a direction towards the photoconductive layer. As a result, the edge portion of the electrode layer terminates at the first portion of the surface of the substrate where the photoconductive layer is directly deposited onto the surface of the substrate. Herein, a thickness $d_3$ of the electrode layer along the electrode-photoconductor interface within the third segment decreases continuously and monotonically along the electrode-photoconductor interface within the third segment towards the edge of the electrode layer in a direction towards the photoconductive layer. As used herein, the term "monotonically" relates to a feature that the thickness $d_3$ of the electrode layer always decreases along the electrode-photoconductor interface within the third segment while the term "continuously" refers to a further feature that no interruption within the decrease occurs.

Herein, a length $l_1$ of the first segment along the respective extension of the electrode layer may preferably be 15 μm to 2500 μm, more preferred 30 μm to 1800 μm, most preferred 45 μm to 950 μm which may approximately equal 150 to 25000, more preferred 300 to 18000, most preferred 450 to 9500 times the thickness $d_0$ of the electrode layer.

Further, a length $l_2$ of the second segment along the respective extension of the electrode layer may, preferably be 65% or less, more preferred 45% or less, most preferred 15% or less, of the thickness $d_0$ of the electrode layer. These values explicitly include the embodiment in which $l_2$ equals zero. In contrast hereto, a length $l_3$ of the third segment along the further extension of the electrode layer may preferably be 20% to 230%, more preferred 35% to 170%, most preferred 55% to 145%, of the thickness $d_0$ of the electrode layer.

Herein, the electrode layer may be or comprise an evaporated metal layer selected from one or more of gold, silver, aluminum, platinum, magnesium, chromium, or titanium. Alternatively, the electrode layer may be or comprise a layer of graphene. Herein, the evaporated metal layer may easily be provided by known evaporation techniques, which may be selected from the group consisting of: vacuum evaporation, sputtering, atomic layer deposition, chemical vapor deposition, spray pyrolysis, electrodeposition, anodization, electro-conversion, electro-less dip growth, successive ionic adsorption and reaction, chemical bath deposition, and solution-gas interface techniques.

However, in a particularly preferred embodiment of the present invention, the electrode layer may be or comprise an electrically conducting laminate comprising a charge carrier layer, a bonding layer, and a barrier layer.

Accordingly, the charge carrier layer may comprise a charge carrier agent which may be designed for transporting charge carriers within the electrode layer and to and/or from the photoconductive layer. As general used, the term "charge carriers" refers to an entity which allows electrical charges to travel as electrons or holes within a specific layer, thus, being capable of being transported to one or more adjacent layers. Preferably, the charge carrier layer may, thus, be placed to directly adjoin the photoconductive layer, thus, facilitating transport of the charge carriers to and/or from the adjacent photoconductive layer. For this purpose, the charge carrier layer may, preferably, comprise atoms selected from at least one of gold, silver, copper, platinum, rhodium, nickel, tin, lead, zinc, tungsten, aluminum, calcium, gallium, chromium, titanium, manganese, beryllium, magnesium, preferably of gold, silver, copper, platinum, rhodium, titanium, manganese, beryllium, magnesium, nickel, tin.

Further, the bonding layer may be applied to the substrate, preferably in a direct manner. Accordingly, the bonding layer may comprise a bonding agent which may be designed for attaching the charge carrier layer to the second portion of the surface of the substrate. For this purpose, the bonding layer may, preferably, comprise atoms selected from at least one of titanium, chromium, tin, beryllium, magnesium, silver, zinc, calcium, zirconium, nickel, aluminum.

Herein, the thickness of the bonding layer may be 0.1 nm, preferably 0.5 nm, more preferred 1 nm, most preferred 2 nm, to 20 nm, preferably to 16 nm, more preferred to 10 nm, most preferred 7 nm.

Further, the barrier layer may be applied to the bonding layer, preferably in a direct manner. Herein, the barrier layer may comprise a barrier agent which may be designed for preventing a direct contact of the bonding agent with the charge carrier layer. As a result, the surface of the electrode layer which adjoins the edge portion of the photoconductive layer that covers the electrode layer may comprise only a single kind of metal or alloy. Consequently, the electrode-photoconductor interface may be free of the bonding agent and of the barrier agent, thus, contributing to the linear current-voltage characteristic of the optical sensor. For this purpose, the barrier layer may, preferably, comprise atoms selected from at least one of nickel, tin, chromium, titanium, manganese, lead, magnesium, preferably of tin, nickel, chromium, magnesium.

Herein, the thickness of the barrier layer may be 5 nm, preferably 16 nm, more preferred 27 nm, most preferred 38 nm, to 170 nm, preferably to 140 nm, more preferred to 95 nm, most preferred 83 nm.

A direct electrical connection from the at least one electrode layer to an external circuit via one or more electrical contacts may be provided by any known measure known from the state of the art, such as plating, welding, soldering, wire bonding, thermosonic bonding, stitch-bonding, ball-bonding, wedge bonding, compliant bonding, thermocompression bonding, anodic bonding, direct bonding, plasma-activated bonding, eutectic bonding, glass frit bonding, adhesive bonding, transient liquid phase diffusion bonding, surface activated bonding, tape-automated bonding, or depositing electrically highly conductive substances, in particular metals like gold, beryllium doped gold, copper, aluminum, silver, platinum, or palladium as well as alloys comprising at least one of the mentioned metals, at the contact zones.

Consequently, upon impingement of the sensor region by the light beam the at least two electrical contacts may provide the sensor signal which depends on the electrical conductivity of the photoconductive material. The term "light beam" generally refers to an amount of light emitted into a specific direction. Thus, the light beam may be a bundle of the light rays having a predetermined extension in a direction perpendicular to a direction of propagation of the light beam. Preferably, the light beam may be or may comprise one or more Gaussian light beams which may be characterized by one or more Gaussian beam parameters, such as one or more of a beam waist, a Rayleigh-length or any other beam parameter or combination of beam parameters suited to characterize a development of a beam diameter and/or a beam propagation in space. Herein, the light beam might be admitted by the object itself, i.e. might originate from the object. Additionally or alternatively, another origin of the light beam is feasible. Thus, as will be outlined in further detail below, one or more illumination sources might be provided which illuminate the object, such as by using one or more primary rays or beams, such as one or more primary rays or beams having a predetermined characteristic. In the latter case, the light beam propagating from the object to the detector might be a light beam which is reflected by the object and/or a reflection device connected to the object.

As further generally used, the term "substrate" refers to an elongated body which is adapted for carrying a layer of a material, specifically of the photoconductive material as used herein in particular for providing mechanical stability to the layer of the photoconductive material. Further, the term "directly" refers to an immediate attachment of the layer of the photoconductive material to the substrate whereas the term "indirectly" refers to an attachment of the layer of the photoconductive material to the substrate via at least one intermediate layer, such as a bonding layer. Preferably, the substrate may be provided as a layer having lateral extensions which exceed a thickness of the layer by a factor of at least 5, preferably of at least 25, more preferred of at least 100. In particular, the thickness of the substrate may be of 10 μm to 2000 μm, preferably of 50 μm to 1000 μm, more preferred of 100 μm to 500 μm.

Preferably, at least one of the substrate and the cover may be optically transparent within a selected wavelength range. Consequently, it may, particularly, be advantageous to select the metal-containing compound used for the cover to be, preferably, optically transparent within the desired wavelength range, in particular, by exhibiting a suitable absorption characteristic. Alternatively or in addition, the material applied for the substrate may exhibit optically transparent properties within the desired wavelength range. In particular, this feature may allow selecting a wider range of materials for the metal-containing compound which may not to be optically transparent within the desired wavelength range as along as the substrate may exhibit sufficient transparency. For this purpose, the substrate may, in particular, comprise at least one at least partially transparent insulating material, wherein the substrate material may, preferably, be selected from at least one of glass, quartz, fused silica; a weakly doped semiconductor, such as silicon or germanium; a metal oxide or ceramic material, in particular from sapphire ($Al_2O_3$); a metal or a semiconducting material, in particular from aluminum doped tin oxide (AZO), indium doped tin oxide (ITO), ZnS, or ZnSe; wherein glass or silicon are particularly preferred.

In a particularly preferred embodiment, the substrate may be directly or indirectly applied to a circuit carrier device, such as a printed circuit board (PCB). Herein, the term "printed circuit board", which is usually abbreviated to "PCB", refers to an electrically non-conductive, planar board, on which at least one sheet of an electrically conductive material, in particular a copper layer, is applied to, specifically laminated, onto the board. Other terms which refer to this type of circuit carrier which, in addition, comprises one or more electronical, electrical, and/or optical elements may also be denoted as a printed circuit assembly, short "PCA", a printed circuit board assembly, short "PCB assembly" or "PCBA", circuit card assembly or short "CCA" or simply "card". In the PCB, the board may comprise a glass epoxy, wherein a cotton paper impregnated with a phenolic resin, typically tan or brown, may also be sued as the board material. Depending on a number of sheets, the printed circuit board may be a single-sided PCB, a two-layer or double-sided PCB, or a multi-layer PCB, wherein different sheets are connected with each other by using so-called "vias". For the purposes of the present invention, an application of a single-sided PCB may be sufficient; however other kinds of printed circuit boards may also be applicable. A double-sided PCB may have metal on both sides while a multi-layer PCB may be designed by sandwiching additional metal layers between further layers of insulating material. In a multi-layer PCB, the layers can be laminated together in an alternating manner, wherein each metal layer may be individually etched and wherein internal vias may be plated through before the multiple layers are laminated together. Further, the vias may be or comprise copper-plated holes which can, preferably, be designed as electrically conducting paths through the insulating board.

The substrate which carries the photoconductive layer, the at least one electrode layer, and, if applicable, further layers may be placed onto the circuit carrier device, such as the PCB, specifically by gluing, soldering, welding, or otherwise depositing it directly or indirectly on an adjacent surface of the circuit carrier device. By way of example, the substrate may be attached to the circuit carrier device, such as the PCB, by a thin film of glue placed between adjacent surfaces of the substrate and of the circuit carrier device, such as the PCB. For further embodiments of the printed circuit board, reference may be made to https://en.wikipedia.org/wiki/Printed_circuit_board. Alternatively, other kinds of circuit carriers may, however, also be applicable.

In a particular embodiment, the optical sensor may, in addition, comprise a cover which may cover an accessible surface of the photoconductive material and, preferably, also of the substrate. As generally used, the phrase "accessible surface" refers to a portion of a body, specifically of the photoconductive layer material and, if applicable, of the substrate, which can be reached by an atmosphere surrounding the optical sensor. Preferably, the cover may be applied in a manner that it may directly contact a top and sides of the photoconductive layer and, preferably, at least the sides of the substrate. As already indicated above, the substrate carries the photoconductive layer such that the top of the photoconductive layer refers to an extended surface of the photoconductive layer which is neither directly nor indirectly applied to the substrate. As already indicated above, the term "layer" refers to an elongated body which comprises two extended surfaces between which sides are arranged. Since the photoconductive material and, optionally, the substrate are provided as a layer, they comprise sides, respectively. Preferably, the cover may fully cover the accessible surface of both the photoconductive layer and of the sides of the substrate, in particular in a preferred arrangement in which the substrate is attached to a circuit carrier device, such as a PCB, specifically in a manner as described above. The cover may be a continuous coating which continuously covers the photoconductive layer and, preferably, of the sides of the substrate. Coating all accessible surfaces of both the photoconductive material and of the substrate may, thus, prevent a direct contact between the material of the photoconductive layer or of the substrate with a surrounding atmosphere, thereby avoiding a degradation of the photoconductive material by external influence, such as humidity and/or oxygen. Thus, the cover may be adapted for providing an improved encapsulation for the photoconductive material. As used herein, the term "encapsulation" may refer to a package, preferably, an hermetic package, especially, in order to avoid as far as possible a partial or full degradation of the optical sensor or a partition thereof, in particular of the photoconductive material comprised within the sensor region of the optical sensor, by external influence, such as by humidity and/or by oxygen comprised in a surrounding atmosphere. Herein, the package may, preferably, be adapted to cover all accessible surfaces of the photoconductive material, wherein it may be taken into account that the photoconductive layer may be deposited on a substrate which may already be adapted to protect a partition of the surfaces of the photoconductive material. Preferably, at least one deposition method may be used for depositing the cover. For this purpose, the at least one deposition method may, in particular, be selected from an atomic layer deposition, a chemical vapor deposition, a sputtering process, or a combination thereof. Consequently, the cover may, in a particularly preferred embodiment, be or comprise an atomic deposition coating, a chemical vapor deposition coating, a sputtered coating, or a coating generated by using at least two of the mentioned deposition methods, wherein the atomic deposition coating or a coating generated by using a combination of atomic deposition and sputtering may especially by preferred.

Accordingly, the cover may comprise at least one metal-containing compound. Herein, the metal-containing compound may, preferably, comprise a metal, wherein the metal may, in particular, be selected from the group consisting of Li, Be, Na, Mg, Al, K, Ca, Sc, Ti, V, Cr, Mn, Fe, Co, Ni, Cu, Zn, Ga, Rb, Sr, Y, Zr, Nb, Mo, Ru, Rh, Pd, Ag, Cd, In, Sn, Cs, Ba, La, Ce, Pr, Nd, Pm, Sm, Eu, Gd, Tb, Dy, Ho, Er, Tm, Yb, Lu, Hf, Ta, W, Re, Os Ir, Pt, Au, Hg, Tl, and Bi. In a specific embodiment, the metal-containing compound may, alternatively, comprise a semimetal, which may also be denominated as a "metalloid", wherein the semimetal may be selected from the group consisting of B, Si, Ge, As, Sb, and Te. Preferably, the at least one metal-containing compound may be selected from the group consisting of Al, Ti, Ta, Mn, Mo, Zr, Hf, and W.

Further, the at least one metal-containing compound may, preferably, be selected from the group comprising an oxide, a hydroxide, a chalcogenide, a pnictide, a carbide, or a combination thereof. As already defined above, the term "chalcogenide" refers to a compound which may comprise a group 16 element of the periodic table apart from an oxide, i.e. a sulfide, a selenide, and a telluride. In a similar fashion, the term "pnictide" refers to a, preferably binary, compound which may comprise a group 15 element of the periodic table, i.e. a nitride, a phosphide, arsenide and an antimonide. By way of example, the metal-containing compound comprised by the cover may be a composition comprising aluminum oxide and/or aluminum hydroxide, which is, as generally used, for sake of simplicity also referred to as $Al_2O_3$. In particular, it may be advantageous to select the metal-containing compound used for the cover to be, preferably, optically transparent within the desired wavelength range, in particular, by exhibiting a suitable absorption characteristic. Alternatively or in addition, the material applied for the substrate may exhibit optically transparent properties within the desired wavelength range. In particular, this feature may allow selecting a wider range of materials for the metal-containing compound which may not to be optically transparent within the desired wavelength range as along as the substrate may exhibit sufficient transparency.

The cover may exhibit a thickness of 10 nm to 600 nm, preferably of 20 nm to 200 nm, more preferred of 40 nm to 120 nm, most preferred of 50 to 95 nm. Herein, the cover may be conformal with respect to an adjacent surface of the photoconductive material or, if applicable, of the substrate. As defined above, the thickness of the conformal cover may, thus, follow the corresponding surface of the photoconductive material or of the substrate within a deviation of ±50 nm, preferably of ±20 nm, mostly preferred of ±10 nm, wherein the deviation may occur over at least for at least 90%, preferably for at least 95%, mostly preferred for at least 99%, of a surface of the cover, hereby leaving aside any contamination or imperfection that may be present on the surface of the cover.

Further, the cover may, concurrently, exhibit a further functionality in addition to the above-mentioned functions of providing encapsulation for the photoconductive material. In this regard, the metal-containing compound may, especially, be selected to be able to, concurrently, exert the desired further function. In particular, the metal-containing compound used for the cover may exhibit a high refractive index, preferably at least 1.2, more preferred at least 1.5, in order to qualify as a suitable anti-reflective material. Further, the cover may exhibit a further functionality, in particular, be selected from scratch-resistance, hydrophilicity, hydrophobicity, self-cleaning, anti-fog, and electrical conductivity. Other types of functions may also be possible, in particular, high-permittivity. Especially for the purpose of the selected functionality, the cover may, in addition, comprise one or more additives, such as one or more stabilizing agents, which may be added in order to accomplish the desired further function of the cover. In particular, the cover may comprise glass or glass particles as stabilizing agent. However, other kinds of additives may also be feasible.

In a particular embodiment, particularly in a case in which it might not be appropriate to provide the cover with the desired further function or in which an extent of the further function as provided by the selected cover may not be sufficient, the cover may, additionally, at least partially be covered by at least one additional layer at least partially deposited on the cover. As an alternative or in addition, the at least one additional layer may at least partially be deposited between the photoconductive layer and the cover. Preferably, the additional layer may be or exhibit the further function and may, thus, comprise at least one of an anti-reflective layer, an optical filter layer, a scratch-resistant layer, a hydrophilic layer, a hydrophobic layer, a self-cleaning layer, an anti-fog layer, a high-permittivity layer, or a conductive layer. Herein, the person skilled in the art may be easily capable of selecting and providing the at least one additional layer. However, other embodiments may also be possible.

In a particularly preferred embodiment, the cover may, partially or fully, cover the electrical contacts, in particular the second edge portion of at least one electrode layer. Herein, the electrical contacts may be bondable by using wires, such as gold or aluminum wires, wherein the electrical contacts may, preferably, be bondable through the cover. In a particular embodiment, an adhesive layer may be provided at the electrical contacts, wherein the adhesive layer may, especially, be adapted for bonding. For this purpose, the adhesive layer may comprise at least one of Ni, Cr, Ti or Pd.

For further details concerning the cover and the additional layer, reference may be made to WO 2018/019921 A1 and European patent application 19 152 511.2, filed Jan. 18, 2019.

In a further aspect of the present invention, a detector for optical detection, in particular of optical radiation, especially within the infrared spectral range, specifically with regard to sensing at least one of transmissivity, absorption, emission and reflectance, provided by at least one light beam, or for determining a position of at least one object, specifically with regard to a depth or to both the depth and a width of the at least one object, is disclosed. According to the present invention, the detector for an optical detection of at least one object comprises:

at least one optical sensor as described elsewhere herein, the optical sensor comprising at least one sensor region, wherein the optical sensor is designed to generate at least one sensor signal in a manner dependent on an illumination of the sensor region by a light beam; and at least one evaluation device, wherein the evaluation device is designed to generate at least one item of information with respect to optical radiation provided by the light beam by evaluating the sensor signal of the optical sensor.

Herein, the listed components may be separate components. Alternatively, two or more of the components may be integrated into one component. Further, the at least one evaluation device may be formed as a separate evaluation device independent from a transfer device, preferably selected from at least one of an optical lens, a mirror, a beam splitter, an optical filter, and the optical sensors, but may preferably be connected to the optical sensors in order to receive the sensor signal. Alternatively, the at least one evaluation device may fully or partially be integrated into the optical sensors.

According to the present invention, the detector comprises at least one of the optical sensors as described elsewhere in this document. Thus, the detector may, preferably, be designed for detecting electromagnetic radiation over a considerably wide spectral range, wherein the infrared (IR) spectral range may particularly be preferred. Herein, indium gallium arsenide (InGaAs) may especially, be selected for the photoconductive layer within the sensor region of the optical sensor for wavelengths up to 2.6 µm, indium arsenide (InAs) for wavelengths up to 3.1 µm, lead sulfide (PbS) for wavelengths up to 3.5 µm, lead selenide (PbSe) for wavelengths up to 5 µm, indium antimonide (InSb) for wavelengths up to 5.5 μm; and mercury cadmium telluride (MCT, HgCdTe) for wavelengths up 16 μm.

As used herein, the term "evaluation device" generally refers to an arbitrary device designed to generate the items of information, i.e. the at least one item of information with regard to sensing at least one of transmissivity, absorption, emission and reflectance, or of at least one object or for determining a position of at least one object, specifically with regard to a depth or both to the depth and a width of the at least one object. As an example, the evaluation device may be or may comprise one or more integrated circuits, such as one or more application-specific integrated circuits (ASICs), and/or one or more digital signal processors (DSPs), and/or one or more field programmable gate arrays (FPGAs), and/or one or more data processing devices, such as one or more computers, preferably one or more microcomputers and/or microcontrollers. Additional components may be comprised, such as one or more preprocessing devices and/or data acquisition devices, such as one or more devices for receiving and/or preprocessing of the sensor signals, such as one or more AD-converters and/or one or more filters. As used herein, the sensor signal may generally refer to one of the longitudinal sensor signal and, if applicable, to the transversal sensor signal. Further, the evaluation device may comprise one or more data storage devices. Further, as outlined above, the evaluation device may comprise one or more interfaces, such as one or more wireless interfaces and/or one or more wire-bound interfaces.

For further information with respect to the detector for optical detection or any components thereof, specifically the evaluation device, reference may be made to WO 2014/097181 A1, WO 2018/019921 A1, and European patent application 19 152 511.2, filed Jan. 18, 2019.

In a further aspect of the present invention, a method for manufacturing an optical sensor is disclosed. The method preferably may be used for manufacturing or producing at least one optical sensor according to the present invention, such as of at least one optical sensor according to one or more of the embodiments disclosed elsewhere in this document in further detail. Thus, for optional embodiments of the method, reference might be made to the description of the various embodiments of the optical sensor.

The method comprises the following steps, which may be performed in the given order or in a different order. Further, additional method steps might be provided which are not listed. Unless explicitly indicated otherwise, two or more or even all of the method steps might be performed simultaneously, at least partially. Further, two or more or even all of the method steps might be performed twice or even more than twice, repeatedly.

The method according to the present invention comprises the following steps:
a) providing a substrate;
b) applying at least one electrode layer to a second portion of the surface of the substrate in a manner that the electrode layer, apart from a first edge portion of the electrode layer, exhibits a thickness $d_0$; and
c) further applying a photoconductive layer, the photoconductive layer having at least one photoconductive material, to a first portion of a surface of the substrate in a manner that also the first edge portion of the electrode layer is covered by an edge portion of the photoconductive layer, whereby an electrode-photoconductor interface is formed at a surface of the electrode layer, wherein the electrode-photoconductor interface is formed in a fashion that the electrode-photoconductor interface comprises a first segment, a second segment, and a third segment;
wherein a thickness $d_1$ of the electrode layer along the electrode-photoconductor interface within the first segment equals the thickness $d_0$ of the electrode layer;
wherein a thickness $d_2$ of the electrode layer along the electrode-photoconductor interface within the second segment is equal to or exceeds the thickness $d_0$ of the electrode layer; and
wherein a thickness $d_3$ of the electrode layer along the electrode-photoconductor interface within the third segment decreases continuously and monotonically along the electrode-photoconductor interface within the third segment towards an edge of the electrode layer.

According to step a), a substrate is provided. In particular, the respective material for the substrate may be selected from the list of the corresponding materials as presented above.

According to step b), at least one electrode layer is applied, preferably directly, to a second portion of the surface of the substrate in a manner that the electrode layer exhibits a thickness $d_0$ apart from a first edge portion of the electrode layer. Preferably, the electrode layer may be applied by depositing an evaporated metal layer onto the second portion of the surface of the substrate, preferably by using known evaporation techniques, wherein the metal layer may, particularly, comprise one or more of silver, aluminum, platinum, magnesium, chromium, titanium, gold, or graphene. Alternatively, the electrical contacts may be provided by a galvanic or chemically deposition process, such as electroless Ni, electroless Au, galvanic Ni, or galvanic Au.

According to step c), a photoconductive layer having at least one photoconductive material is further applied to a first portion of a surface of the substrate in a manner that also the first edge portion of the electrode layer is covered by an edge portion of the photoconductive layer. As a result, an electrode-photoconductor interface is formed at a surface of the electrode layer in a fashion that the electrode-photoconductor interface comprises a first segment, a second segment, and a third segment having extensions and a thickness as described elsewhere herein in more detail.

In a particularly preferred embodiment of the present invention, the electrode layer may be formed as an electrically conducting laminate by applying a bonding layer directly onto the second portion of the surface of the substrate,
wherein the bonding layer comprises a bonding agent being designed for attaching a charge carrier layer to the substrate;
further applying a barrier layer directly onto the bonding layer, wherein the barrier layer comprises a barrier agent being designed for preventing a direct contact of the bonding agent with the charge carrier layer; and
further applying the charge carrier layer directly onto the barrier layer, wherein the charge carrier layer comprises a charge carrier agent being designed for transporting charge carriers to and/or from the photoconductive layer.

As used herein, the term "directly" refers to an immediate attachment of the respective layer to a respective base. For further details concerning the charge carrier layer, the bonding layer, and the barrier layer, reference may be made to the description elsewhere herein.

As already described above, at least one cover may, further, be deposited on the accessible surface of the photoconductive material and, preferably, also of the substrate. Alternatively or in addition, at least one additional layer may at least partially be deposited on the photoconductive layer and, if applicable, subsequently be coated by the cover. Herein, the additional layer may be selected to be or comprise at least one of an anti-reflective layer, an optical filter layer, an encapsulating layer, a scratch-resistant layer, a hydrophilic layer, a hydrophobic layer, a self-cleaning layer, an anti-fog layer, a high-permittivity layer, or a conductive layer.

As already mentioned above, the photoconductive layer may comprise at least two individual sensor areas, preferably an array of individual sensor areas, which are directly or indirectly applied to the same substrate, also denoted as "common substrate", which may, thus, exhibit a considerably large area. In this particular embodiment, the individual sensor areas may directly or indirectly applied to the common substrate, wherein the individual sensor areas are connected to at least one electrode layer according to the present invention. Thereafter, the individual sensor areas are separated from each other in a fashion that each of the individual sensor areas is carried by a respective portion of the substrate.

In addition, further details concerning the manufacturing process for the optical sensor may be found elsewhere in this document.

The devices according to the present invention may be used in combination with surface mount technology packages such as bump chip carriers, ceramic leadless chip carriers, leadless chip carriers, leaded chip carriers, leaded ceramic chip carriers, dual lead-less chip carriers, plastic leaded chip carrier, package on package chip carriers, or the like. Further, devices according to the present invention may be used in combination with standard through-hole or source mount technology semiconductor packages such as DO-204, DO-213, Metal electrode leafless face, DO-214, SMA, SMB, SMC, GF1, SOD, SOT, TSOT, TO-3, TO-5, TO-8, TO-18, TO-39, TO-46, TO-66, TO-92, TO-99, TO-100, TO-126, TO-220, TO-226, TO-247, TO252, TO-263, TO-263 THIN, SIP, SIPP, DFN, DIP, DIL, Flat Pack, SO, SOIC, SOP, SSOP, TSOP, TSSOP, ZIP, LCC, PLCC, QFN, QFP, QUIP, QUIL, BGA, eWLB, LGA, PGA, COB, COF, COG, CSP, Flip Chip, PoP, QP, UICC, WL-CSP, WLP, MDIP, PDIP, SDIP, CCGA, CGA, CERPACK, CQGP, LLP, LGA, LTCC, MCM, MICRO SMDXT, or the like. Further, devices according to the present invention may be used in combination with pin grid arrays (PGA) such as OPGA, FCPGA, PAC, PGA, CPGA, or the like. Further, devices according to the present invention may be used in combination with flat packages such as CFP, CQFP, BQFP, DFN, ETQFP, PQFN, PQFP, LQFP, QFN, QFP, MQFP, HVQFP, SIDEBRAZE, TQFP, TQFN, VQFP, ODFN, or the like. Further, devices according to the present invention may be used in combination with small outline packages such as SOP, CSOP MSOP, PSOP, PSON, PSON, QSOP, SOIC, SSOP, TSOP, TSSOP, TVSOP, pMAX, WSON, or the like. Further, devices according to the present invention may be used in combination with chip-scale packages such as CSP, TCSP, TDSP, MICRO SMD, COB, COF, COG, or the like. Further, devices according to the present invention may be used in combination with ball grid arrays such as FBGA, LBGA, TEPBGA, CBGA, OBGA, TFBGA, PBGA, MAPBGA, UCSP, pBGA, LFBGA, TBGA, SBGA, UFBGA, or the like. Further, devices according to the present invention may be combined with further electronic devices such as chips in multi-chip packages such as SiP, PoP, 3D-SiC, WSI, proximity communication, or the like. For additional information concerning integrate circuit packings reference may be made to the following sources at https://en.wikipedia.org/wiki/List_of_integrated_circuit-_packaging_types or https://en.wikipedia.org/wiki/List_of_integrated_circuit-_package_dimensions.

In a further aspect of the present invention, a use of a detector according to the present invention is disclosed. Therein, a use of the detector for a purpose of use is selected from the group consisting of: gas sensing, fire detection, flame detection, heat detection, smoke detection, combustion monitoring, spectroscopy, temperature sensing, motion sensing, industrial monitoring, chemical sensing, exhaust gas monitoring, a security application. In particular, the detector may be used for infra-red detection applications, heat-detection applications, thermometer applications, heat-seeking applications, flame-detection applications, fire-detection applications, smoke-detection applications, temperature sensing applications, spectroscopy applications, or the like. Further, the detector may be used to monitor exhaust gas, to monitor combustion processes, to monitor industrial processes, to monitor chemical processes, to monitor food processing processes, or the like. Further, the detector may be used for temperature control, motion control, exhaust control, gas sensing, gas analytics, motion sensing, chemical sensing, or the like. For further uses of the optical sensor and the detector as disclosed herein, reference may be made to WO 2016/120392 A1 and WO 2018/019921 A1. However, further fields of applications may still be conceivable.

The above-described optical sensor and the detector, the method, and the proposed uses have considerable advantages over the prior art. Thus, the optical sensor according to the present invention may be particularly sensitive over at least a partition of the IR spectral range, thus providing efficient, reliable and large-area position sensitive devices for the infrared spectral range. As compared to devices known in the art, it can be demonstrated that the optical sensor as proposed herein may a linear current-voltage characteristic according to Ohm's law.

Summarizing, in the context of the present invention, the following embodiments are regarded as particularly preferred:

Embodiment 1

An optical sensor, comprising
a substrate;
a photoconductive layer applied to a first portion of a surface of the substrate, the photoconductive layer having at least one photoconductive material;
at least one electrode layer applied to a second portion of the surface of the substrate, wherein the electrode layer, apart from a first edge portion of the electrode layer, exhibits a thickness $d_0$, wherein the first edge portion of the electrode layer is covered by an edge portion of the photoconductive layer in a manner that an electrode-photoconductor interface is formed at a surface of the electrode layer,
wherein the electrode-photoconductor interface comprises a first segment, a second segment, and a third segment;
wherein a thickness $d_1$ of the electrode layer along the electrode-photoconductor interface within the first segment equals the thickness $d_0$ of the electrode layer;

wherein a thickness $d_2$ of the electrode layer along the electrode-photoconductor interface within the second segment is equal to or exceeds the thickness $d_0$ of the electrode layer; and wherein a thickness $d_3$ of the electrode layer along the electrode-photoconductor interface within the third segment decreases continuously and monotonically along the electrode-photoconductor interface within the third segment towards an edge of the electrode layer.

Embodiment 2

The optical sensor according to the preceding embodiment, wherein the second segment adjoins the first segment, and wherein the third segment adjoins the second segment.

Embodiment 3

The optical sensor according to any one of the preceding embodiments, wherein a maximum elevation $h=d_2-d_0$ of the electrode layer along the electrode-photoconductor interface within the second segment with respect to the thickness $d_0$ of the electrode layer exceeds the thickness $d_0$ of the electrode layer by 27% or less.

Embodiment 4

The optical sensor according to the preceding embodiment, wherein the maximum elevation h exceeds the thickness $d_0$ of the electrode layer by 17% or less.

Embodiment 5

The optical sensor according to the preceding embodiment, wherein the maximum elevation h exceeds the thickness $d_0$ of the electrode layer by 7% or less.

Embodiment 6

The optical sensor according to any one of the preceding embodiments, wherein a length $l_2$ of the second segment is 65% or less of the thickness $d_0$ of the electrode layer.

Embodiment 7

The optical sensor according to the preceding embodiment, wherein the length $l_2$ of the second segment is 45% or less of the thickness $d_0$ of the electrode layer.

Embodiment 8

The optical sensor according to the preceding embodiment, wherein the length $l_2$ of the second segment is 15% or less of the thickness $d_0$ of the electrode layer.

Embodiment 9

The optical sensor according to any one of the preceding embodiments, wherein a length $l_3$ of the third segment is 20% to 230% of the thickness $d_0$ of the electrode layer.

Embodiment 10

The optical sensor according to the preceding embodiment, wherein a length $l_3$ of the third segment is 35% to 170% of the thickness $d_0$ of the electrode layer.

Embodiment 11

The optical sensor according to the preceding embodiment, wherein a length $l_3$ of the third segment is 55% to 145% of the thickness $d_0$ of the electrode layer.

Embodiment 12

The optical sensor according to any one of the preceding embodiments, wherein the thickness $d_0$ of the electrode layer is 5 nm, preferably 10 nm, more preferred 20 nm, most preferred 25 nm, to 1000 nm, preferably to 500 nm, more preferred to 250 nm, most preferred 200 nm.

Embodiment 13

The optical sensor according to any one of the preceding embodiments, wherein the electrode layer is an electrically conducting laminate comprising
a charge carrier layer directly adjoining the photoconductive layer, wherein the charge carrier layer comprises a charge carrier agent being designed for transporting charge carriers within the electrode layer and to and/or from the photoconductive layer;
a bonding layer directly applied to the substrate, wherein the bonding layer comprises a bonding agent being designed for attaching the charge carrier layer to the second portion of the surface of the substrate; and
a barrier layer directly applied to the bonding layer, wherein the barrier layer comprises a barrier agent being designed for preventing a direct contact of the bonding agent with the charge carrier layer.

Embodiment 14

The optical sensor according to the preceding embodiment, wherein the charge carrier layer at the electrode-photoconductor interface only comprises the charge carrier agent.

Embodiment 15

The optical sensor according to any one of the two preceding embodiments, wherein the charge carrier agent is selected from atoms of gold, silver, copper, platinum, rhodium, nickel, tin, lead, zinc, tungsten, aluminum, calcium, gallium, chromium, titanium, manganese, beryllium, magnesium, preferably of gold, silver, copper, platinum, rhodium, titanium, manganese, beryllium, magnesium, nickel, tin.

Embodiment 16

The optical sensor according to any one of the three preceding embodiments, wherein the bonding agent is selected from atoms of titanium, chromium, tin, beryllium, magnesium, silver, zinc, calcium, zirconium, nickel, aluminum.

Embodiment 17

The optical sensor according to any one of the four preceding embodiments, wherein the barrier agent is selected from atoms of nickel, tin, chromium, titanium, manganese, lead, magnesium, preferably of tin, nickel, chromium, magnesium.

Embodiment 18

The optical sensor according to any one of the five preceding embodiments, wherein the thickness of the bonding layer is 0.1 nm, preferably 0.5 nm, more preferred 1 nm, most preferred 2 nm, to 20 nm, preferably to 16 nm, more preferred to 10 nm, most preferred 7 nm.

Embodiment 19

The optical sensor according to any one of the five preceding embodiments, wherein the thickness of the barrier layer may be 5 nm, preferably 16 nm, more preferred 27 nm, most preferred 38 nm, to 170 nm, preferably to 140 nm, more preferred to 95 nm, most preferred 83 nm.

Embodiment 20

The optical sensor according to any one of the preceding embodiments, wherein the photoconductive material comprises an inorganic photoconductive material.

Embodiment 21

The optical sensor according to the preceding embodiment, wherein the inorganic photoconductive material comprises one or more of selenium, tellurium, a selenium-tellurium alloy, a photoconductive metal oxide, a group IV element or compound, a III-V compound, a II-VI compound, a chalcogenide, a pnictogenide, a halide, and solid solutions and/or doped variants thereof.

Embodiment 22

The optical sensor according to the preceding embodiment, wherein the chalcogenide is selected from a group comprising sulfide chalcogenides, selenide chalcogenides, telluride chalcogenides, ternary chalcogenides, quaternary and higher chalcogenides.

Embodiment 23

The optical sensor according to the preceding embodiment, wherein the sulfide chalcogenide is selected from a group comprising lead sulfide (PbS), cadmium sulfide (CdS), zinc sulfide (ZnS), mercury sulfide (HgS), silver sulfide ($Ag_2S$), manganese sulfide (MnS), bismuth trisulfide ($Bi_2S_3$), antimony trisulfide ($Sb_2S_3$), arsenic trisulfide ($As_2S_3$), tin (II) sulfide (SnS), tin (IV) disulfide ($SnS_2$), indium sulfide ($In_2S_3$), copper sulfide (CuS), cobalt sulfide (CoS), nickel sulfide (NiS), molybdenum disulfide ($MoS_2$), iron disulfide ($FeS_2$), chromium trisulfide ($CrS_3$), copper indium sulfide (CIS), copper indium gallium selenide (CIGS), copper zinc tin sulfide (CZTS), and solid solutions and/or doped variants thereof.

Embodiment 24

The optical sensor according to any one of the two preceding embodiments, wherein the selenide chalcogenide is selected from a group comprising lead selenide (PbSe), cadmium selenide (CdSe), zinc selenide (ZnSe), bismuth triselenide ($Bi_2Se_3$), mercury selenide (HgSe), antimony triselenide ($Sb_2Se_3$), arsenic triselenide ($As_2Se_3$), nickel selenide (NiSe), thallium selenide (TlSe), copper selenide (CuSe), molybdenum diselenide ($MoSe_2$), tin selenide (SnSe), cobalt selenide (CoSe), indium selenide ($In_2Se_3$), copper zinc tin selenide (CZTSe), and solid solutions and/or doped variants thereof.

Embodiment 25

The optical sensor according to any one of the three preceding embodiments, wherein the telluride chalcogenide is selected from a group comprising lead telluride (PbTe), cadmium telluride (CdTe), zinc telluride (ZnTe), mercury telluride (HgTe), bismuth tritelluride ($Bi_2Te_3$), arsenic tritelluride ($As_2Te_3$), antimony tritelluride ($Sb_2Te_3$), nickel telluride (NiTe), thallium telluride (TlTe), copper telluride (CuTe), molybdenum ditelluride ($MoTe_2$), tin telluride (SnTe), and cobalt telluride (CoTe), silver telluride ($Ag_2Te$), indium telluride ($In_2Te_3$), and solid solutions and/or doped variants thereof.

Embodiment 26

The optical sensor according to any one of the four preceding embodiments, wherein the ternary chalcogenide is selected from a group comprising mercury cadmium telluride (HgCdTe), mercury zinc telluride (HgZnTe), mercury cadmium sulfide (HgCdS), lead cadmium sulfide (PbCdS), lead mercury sulfide (PbHgS), copper indium disulfide ($CuInS_2$), cadmium sulfoselenide (CdSSe), zinc sulfoselenide (ZnSSe), thallous sulfoselenide (TlSSe), cadmium zinc sulfide (CdZnS), cadmium chromium sulfide ($CdCr_2S_4$), mercury chromium sulfide ($HgCr_2S_4$), copper chromium sulfide ($CuCr_2S_4$), cadmium lead selenide (CdPbSe), copper indium diselenide ($CuInSe_2$), indium gallium arsenide (InGaAs), lead oxide sulfide ($Pb_2OS$), lead oxide selenide ($Pb_2OSe$), lead sulfoselenide (PbSSe), arsenic selenide telluride ($As_2Se_2Te$), indium gallium phosphide (InGaP), gallium arsenide phosphide (GaAsP), aluminum gallium phosphide (AlGaP), cadmium selenite ($CdSeO_3$), cadmium zinc telluride (CdZnTe), cadmium zinc selenide (CdZnSe), a copper-zinc-tin sulfur-selenium chalcogenide (CZTSSe), and solid solutions and/or doped variants thereof.

Embodiment 27

The optical sensor according to any one of the five preceding embodiments, wherein the photoconductive metal oxide is selected from a group comprising copper (II) oxide (CuO), copper (I) oxide ($CuO_2$), nickel oxide (NiO), zinc oxide (ZnO), silver oxide ($Ag_2O$), manganese oxide (MnO), titanium dioxide ($TiO_2$), barium oxide (BaO), lead oxide (PbO), cerium oxide ($CeO_2$), bismuth oxide ($Bi_2O_3$), cadmium oxide (CdO), and solid solutions and/or doped variants thereof.

Embodiment 28

The optical sensor according to any one of the six preceding embodiments, wherein the II-VI compound is selected from a group comprising cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), mercury telluride (HgTe), cadmium zinc telluride (CdZnTe), mercury cadmium telluride (HgCdTe), mercury zinc telluride (HgZnTe), and mercury zinc selenide (HgZnSe), and solid solutions and/or doped variants thereof.

Embodiment 29

The optical sensor according to any one of the seven preceding embodiments, wherein the III-V compound is selected from a group comprising indium antimonide (InSb), boron nitride (BN), boron phosphide (BP), boron arsenide (BAs), aluminum nitride (AlN), aluminum phosphide (AlP), aluminum arsenide (AlAs), aluminum antimonide (AlSb), indium nitride (InN), indium phosphide (InP), indium arsenide (InAs), indium antimonide (InSb), gallium nitride (GaN), gallium phosphide (GaP), gallium arsenide (GaAs), and gallium antimonide (GaSb), and solid solutions and/or doped variants thereof.

Embodiment 30

The optical sensor according to any one of the eight preceding embodiments, wherein the group IV element or compound is selected from a group comprising doped diamond (C), doped silicon (Si), silicon carbide (SiC), and silicon germanium (SiGe), and solid solutions and/or doped variants thereof.

Embodiment 31

The optical sensor according to any one of the preceding embodiments, wherein the substrate is an electrically insulating substrate.

Embodiment 32

The optical sensor according to any one of the preceding embodiments, wherein the substrate comprises one of glass, quartz, fused silica; a weakly doped semiconductor, such as silicon or germanium; a metal oxide or ceramic material, in particular from sapphire ($Al_2O_3$); a metal or a semiconducting material, in particular from aluminum doped tin oxide (AZO), indium doped tin oxide (ITO), ZnS, or ZnSe; wherein glass or silicon are particularly preferred.

Embodiment 33

The optical sensor according to any one of the preceding embodiments, wherein the substrate has a thickness of 10 µm to 1000 µm, preferably of 50 µm to 500 µm, more preferred of 100 µm to 250 µm.

Embodiment 34

The optical sensor according to any one of the preceding embodiments, wherein the substrate is directly or indirectly applied to a circuit carrier device.

Embodiment 35

The optical sensor according to the preceding embodiment, wherein the substrate is attached to the circuit carrier device via a thin film of glue placed between adjacent surfaces of the substrate and of the circuit carrier device.

Embodiment 36

The optical sensor according to any one of the two preceding embodiments, wherein the circuit carrier device is a printed circuit board.

Embodiment 37

The optical sensor according to any one of the preceding embodiments, wherein the electrode layer comprises a second edge portion not being covered by the photoconductive layer.

Embodiment 38

The optical sensor according to the preceding embodiment, wherein the second edge portion is designated for providing electrical connection to the electrode layer.

Embodiment 39

The optical sensor according to the preceding embodiment, wherein direct or indirect electrical connection is provided between the second edge portion of the electrode layer and a contact pad on the circuit carrier device.

Embodiment 40

The optical sensor according to the preceding embodiment, wherein the electrical connection between the second edge portion of the electrode layer and a contact pad on the circuit carrier device is bondable through a cover.

Embodiment 41

The optical sensor according to any one of the preceding embodiments, further comprising a cover which covers an accessible surface of the photoconductive material and, preferably, of the substrate.

Embodiment 42

The optical sensor according to any one of the preceding embodiments, wherein the cover is an amorphous layer comprising at least one metal-containing compound.

Embodiment 43

The optical sensor according to the preceding embodiment, wherein the at least one metal-containing compound comprises a metal or a semimetal, wherein the metal is selected from the group consisting of Li, Be, Na, Mg, Al, K, Ca, Sc, Ti, V, Cr, Mn, Fe, Co, Ni, Cu, Zn, Ga, Rb, Sr, Y, Zr, Nb, Mo, Ru, Rh, Pd, Ag, Cd, In, Sn, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, and Bi, and wherein the semimetal is selected from the group consisting of B, Si, Ge, As, Sb, and Te.

Embodiment 44

The optical sensor according to the preceding embodiment, wherein the at least one metal-containing compound comprises a metal selected from the group consisting of Al, Ti, Ta, Mn, Mo, Zr, Hf, and W.

Embodiment 45

The optical sensor according to any one of the two preceding embodiments, wherein the at least one metal-containing compound is selected from the group comprising an oxide, a hydroxide, a chalcogenide, a pnictide, a carbide, or a combination thereof.

Embodiment 46

The optical sensor according to the preceding embodiment, wherein the at least one metal-containing compound comprises at least one oxide, at least one hydroxide, or a combination thereof of Al, Ti, Zr or Hf; or a nitride of Si.

Embodiment 47

The optical sensor according to any one of the six preceding embodiments, wherein the cover directly contacts a top and sides of the photoconductive layer and, preferably, at least the sides of the substrate.

Embodiment 48

The optical sensor according to any one of the seven preceding embodiments, wherein the cover has a thickness of 10 nm to 600 nm, preferably of 20 nm to 200 nm, more preferred of 40 nm to 120 nm, most preferred of 50 to 95 nm.

Embodiment 49

The optical sensor according to any one of the eight preceding embodiments, wherein the cover is a conformal cover with respect to an adjacent surface of the photoconductive layer and, preferably, of the substrate.

Embodiment 50

The optical sensor according to any one of the nine preceding embodiments, wherein the cover additionally exhibits a further functionality selected from at least one of: scratch-resistance, hydrophilicity, hydrophobicity, self-cleaning, anti-fog, and electrical conductivity.

Embodiment 51

The optical sensor according to any one of the ten preceding embodiments, wherein the cover is further at least partially coated with at least one additional layer and/or wherein the at least one additional layer is at least partially deposited between the photoconductive layer and the cover.

Embodiment 52

The optical sensor according to the preceding embodiment, wherein the additional layer is or comprises at least one of an anti-reflective layer, an optical filter layer, an encapsulating layer, a scratch-resistant layer, a hydrophilic layer, a hydrophobic layer, a self-cleaning layer, an anti-fog layer, a high-permittivity layer, or a conductive layer.

Embodiment 53

A detector for an optical detection of at least one object, comprising:
- at least one optical sensor according to any one of the preceding embodiments, the optical sensor comprising at least one sensor region, wherein the optical sensor is designed to generate at least one sensor signal in a manner dependent on an illumination of the sensor region by a light beam; and
- at least one evaluation device, wherein the evaluation device is designed to generate at least one item of information with respect to optical radiation provided by the light beam by evaluating the sensor signal of the optical sensor.

Embodiment 54

The detector according to the preceding embodiment, wherein the detector is adapted to generate the sensor signal by one or more of measuring an electrical resistance or a conductivity of at least one part of the sensor region.

Embodiment 55

The detector according to the preceding embodiment, wherein the detector is adapted to generate the sensor signal by performing at least one current-voltage measurement and/or at least one voltage-current-measurement.

Embodiment 56

The detector according to any one of the preceding embodiments relating to a detector, furthermore comprising at least one illumination source.

Embodiment 57

The detector according to the preceding embodiment, wherein the illumination source is selected from: an illumination source, which is at least partly connected to the object and/or is at least partly identical to the object; an illumination source which is designed to at least partly illuminate the object with a primary radiation.

Embodiment 58

The detector according to the preceding embodiment, wherein the light beam is generated by a reflection of the primary radiation on the object and/or by light emission by the object itself, stimulated by the primary radiation.

Embodiment 59

The detector according to the preceding embodiment, wherein the spectral sensitivity of the optical sensor is covered by the spectral range of the illumination source.

Embodiment 60

The detector according to any one of the preceding embodiments relating to a detector, wherein the detector further comprises at least one transfer device, the transfer device being adapted to guide the light beam onto the optical sensor.

Embodiment 61

A method for manufacturing an optical sensor, the method comprising the following steps:
- a) providing a substrate;
- b) applying at least one electrode layer to a second portion of the surface of the substrate in a manner that the electrode layer, apart from a first edge portion of the electrode layer, exhibits a thickness $d_0$; and
- c) further applying a photoconductive layer, the photoconductive layer having at least one photoconductive material, to a first portion of a surface of the substrate in a manner that also the first edge portion of the electrode layer is covered by an edge portion of the photoconductive layer, whereby an electrode-photoconductor interface is formed at a surface of the electrode layer, wherein the electrode-photoconductor interface is formed in a fashion that the electrode-photoconductor interface comprises a first segment, a second segment, and a third segment;

wherein a thickness $d_1$ of the electrode layer along the electrode-photoconductor interface within the first segment equals the thickness $d_0$ of the electrode layer;

wherein a thickness $d_2$ of the electrode layer along the electrode-photoconductor interface within the second segment is equal to or exceeds the thickness $d_0$ of the electrode layer; and wherein a thickness $d_3$ of the electrode layer along the electrode-photoconductor interface within the third segment decreases continuously and monotonically along the electrode-photoconductor interface within the third segment towards an edge of the electrode layer.

Embodiment 62

The method according to the preceding embodiment, wherein the electrode-photoconductor interface is formed in a fashion that the second segment adjoins the first segment and the third segment adjoins the second segment.

Embodiment 63

The method according to the preceding embodiment, wherein the method is configured for manufacturing the optical sensor according to the Embodiments 1 to 52.

Embodiment 64

The method according to any one of the preceding embodiments referring to a method, wherein the electrode layer is formed as an electrically conducting laminate by
applying a bonding layer directly onto the second portion of the surface of the substrate, wherein the bonding layer comprises a bonding agent being designed for attaching a charge carrier layer to the substrate;
further applying a barrier layer directly onto the bonding layer, wherein the barrier layer comprises a barrier agent being designed for preventing a direct contact of the bonding agent with the charge carrier layer; and
further applying the charge carrier layer directly onto the barrier layer, wherein the charge carrier layer comprises a charge carrier agent being designed for transporting charge carriers to and/or from the photoconductive layer.

Embodiment 65

The method according to any one of the preceding embodiments referring to a method, wherein at least one deposition method is used for depositing the electrode layer, wherein the at least one deposition method is selected from an atomic layer deposition process, a chemical vapor deposition process, a sputtering process, or a combination thereof.

Embodiment 66

The use of a detector according to any one of the preceding claims referring to a detector, for a purpose of use, selected from the group consisting of: gas sensing, fire detection, flame detection, heat detection, smoke detection, combustion monitoring, spectroscopy, temperature sensing, motion sensing, industrial monitoring, chemical sensing, exhaust gas monitoring, a security application.

BRIEF DESCRIPTION OF THE FIGURES

Further optional details and features of the invention are evident from the description of preferred exemplary embodiments which follows in conjunction with the dependent claims. In this context, the particular features may be implemented alone or with features in combination. The invention is not restricted to the exemplary embodiments. The exemplary embodiments are shown schematically in the figures. Identical reference numerals in the individual figures refer to identical elements or elements with identical function, or elements which correspond to one another with regard to their functions.

Specifically, in the figures.

EXEMPLARY EMBODIMENTS

Figure 1:
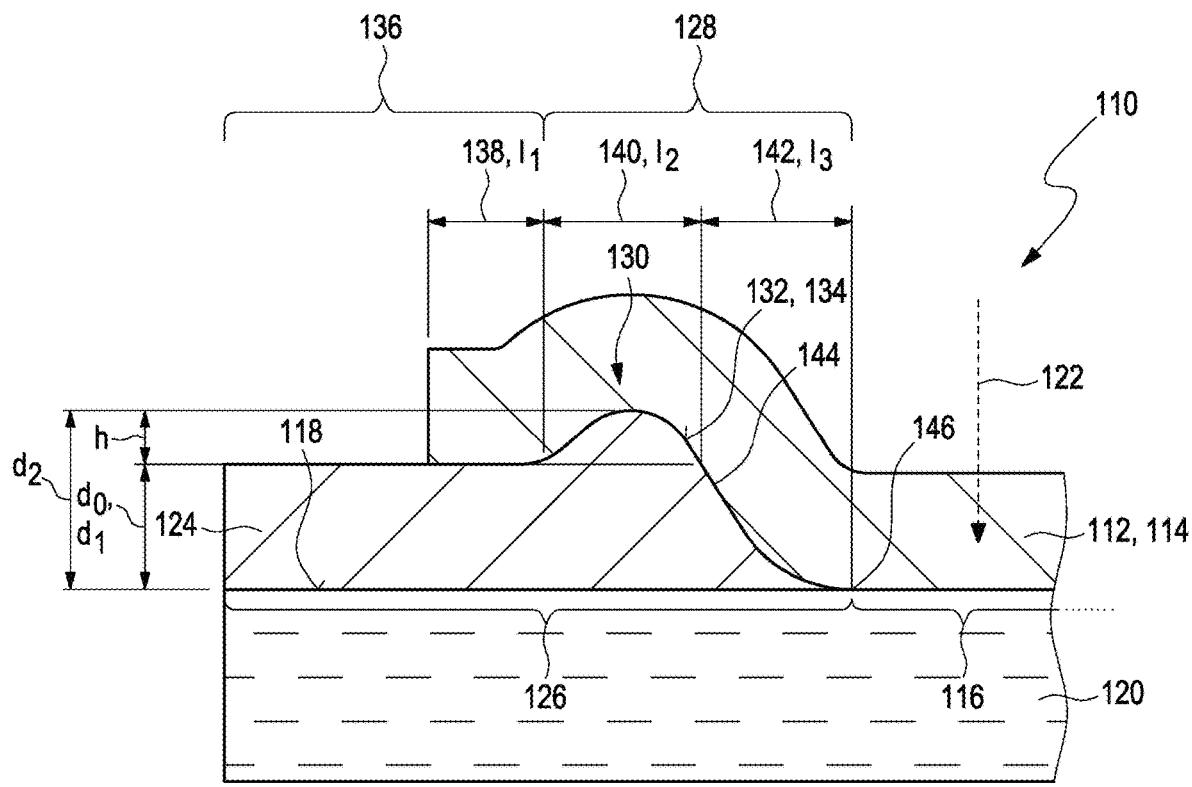
FIG. 1 shows a preferred exemplary embodiment of an optical sensor according to the present invention.

FIG. 1 illustrates, in a highly schematic fashion, an exemplary embodiment of an optical sensor 110 according to the present invention in a sectional side view. Accordingly, the optical sensor 110 has a photoconductive a layer 112 which comprises at least one photoconductive material 114. In particular, the photoconductive layer 112 may exhibit a thickness of 10 nm to 100 µm, preferably of 100 nm to 10 µm, more preferred of 300 nm to 5 µm. In the exemplary embodiments of FIG. 1, the photoconductive material 114 may be or comprise at least one chalcogenide which can, preferably, be selected from a group comprising sulfide chalcogenides, selenide chalcogenides, telluride chalcogenides, and ternary chalcogenides. In particular, the photoconductive material 114 may be or comprise a sulfide, preferably lead sulfide (PbS), a selenide, preferably lead selenide (PbSe), or a ternary chalcogenide, preferably lead sulfoselenide (PbSSe). Since many of the preferred photoconductive materials 114 are, generally, known to exhibit a distinctive absorption characteristic within the infrared spectral range, the optical sensor 110 may, preferably, be used as an infrared sensor. However, other embodiments and/or other photoconductive materials, in particular, the photoconductive materials 114 as described elsewhere herein for the present purpose, may also be feasible.

Figure 3:
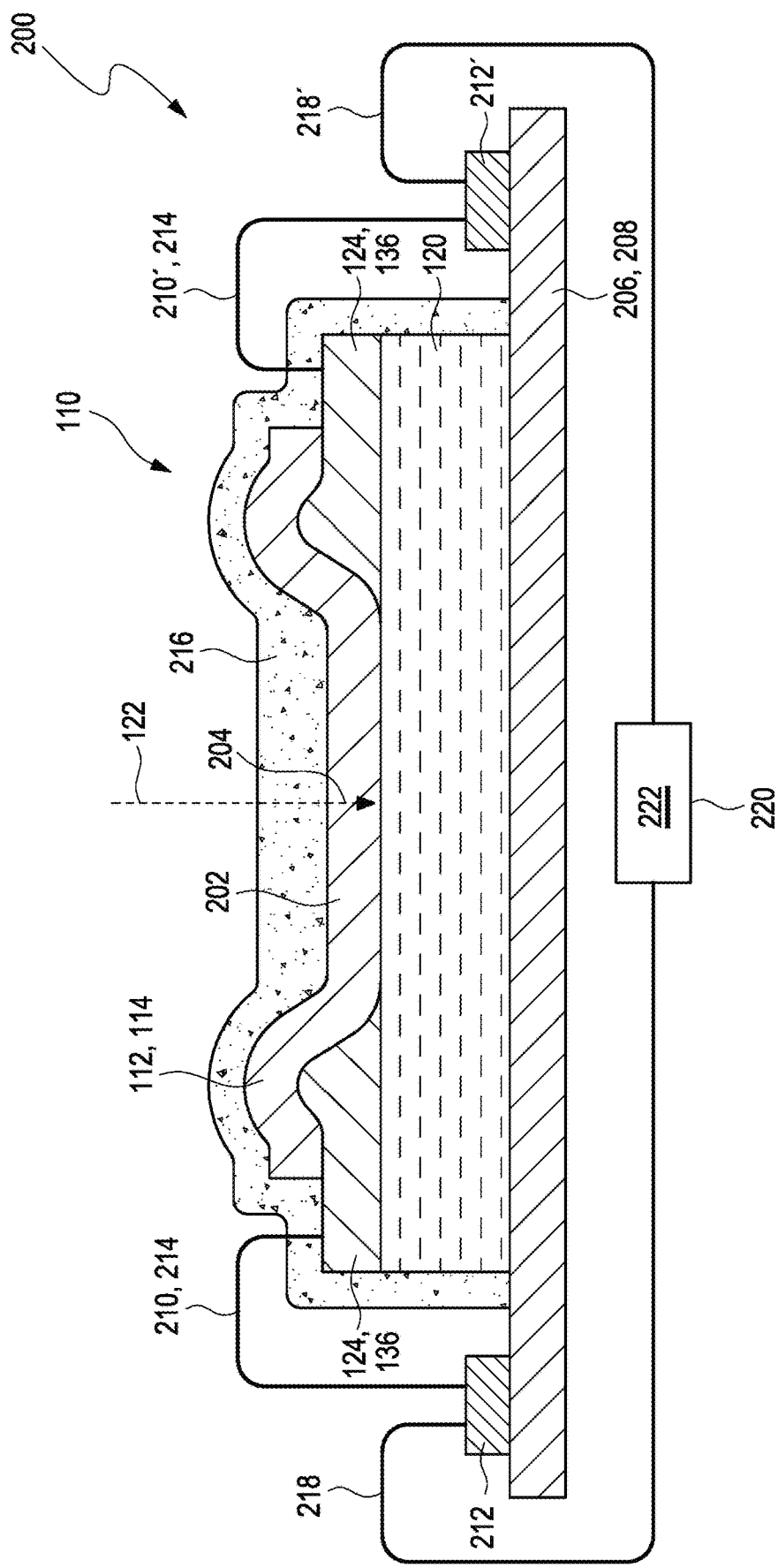
FIG. 3 shows a preferred exemplary embodiment of a detector according to the present invention.

As further illustrated in FIG. 1, the at least one photoconductive layer 112 is, preferably directly, applied to a first portion 116 of a surface 118 of a substrate 120, wherein the substrate 120 may, preferentially, be or comprise an insulating substrate. Herein, the thickness of the substrate 120 may be of 10 µm to 2000 µm, preferably of 50 µm to 1000 µm, more preferred of 100 µm to 500 µm. In order to allow an incident light beam 122 to reach the photoconductive material 114 in order to optically modify an electrical conductivity within the photoconductive layer 112, at least one of the substrate 120 and at least one cover as depicted in FIG. 3 which may cover the photoconductive layer 112 at least partially may, in particular, be optically transparent within a desired wavelength range, such as in the infrared spectral range or a partition thereof. Thus, the substrate 120 may comprise a material selected from one of glass, quartz, fused silica; a weakly doped semiconductor, such as silicon or germanium; a metal oxide or ceramic material, in particular from sapphire ($Al_2O_3$); a metal or a semiconducting material, in particular from aluminum doped tin oxide (AZO), indium doped tin oxide (ITO), ZnS, or ZnSe; wherein glass or silicon are particularly preferred. Preferably, the substrate 120 may be attached, preferably via a thin film of glue, to a circuit carrier device as depicted in FIG. 3, in particular to a printed circuit board (PCB).

Further according to the present invention, the optical sensor 110 has an electrode layer 124, which is applied to a second portion 126 of the surface 118 of the substrate 120. As depicted in FIG. 1, the electrode layer 124 may, preferably, exhibits a constant thickness $d_0$ which is constant apart from a first edge portion 128 of the electrode layer 124. Herein, the thickness $d_0$ of the electrode layer may be 5 nm, preferably 10 nm, more preferred 20 nm, most preferred 25 nm, to 1000 nm, preferably to 500 nm, more preferred to 250 nm, most preferred 200 nm.

Over the first edge portion 128, the electrode layer 124 is covered by an edge portion 130 of the photoconductive layer 112 in a manner that an electrode-photoconductor interface 132 is formed at a surface 134 of the electrode layer 124. In contrast hereto, a second edge portion 136 of the electrode layer 124 is not covered by the photoconductive layer 112, thus allowing one or more electrical contacts depicted in FIG. 3 to be applied to the electrode layer 124, wherein the at least one electrical contact can be used for providing electrical connection to an external circuit via one or more leads (not depicted here), such as to one or more pads as comprised by the circuit carrier device, such as a PCB as depicted in FIG. 3.

In accordance with the present invention, the electrode-photoconductor interface 132 comprises a first segment 138, a second segment 140, and a third segment 142 as shown in FIG. 1. As illustrated there, the second segment adjoins 140 the first segment 138, and the third segment 142 adjoins the second segment 140. Herein, a thickness $d_1$ of the electrode layer 124 along the electrode-photoconductor interface 132 within the first segment 138 equals the thickness $d_0$ of the electrode layer 124. Herein, a length $l_1$ of the first segment 138 may, preferably, be 15 μm to 2500 μm, more preferred 30 μm to 1800 μm, most preferred 45 μm to 950 μm which may approximately equal 150 to 25000, more preferred 300 to 18000, most preferred 450 to 9500 times the thickness $d_0$ of the electrode layer 124.

Further, a thickness $d_2$ of the electrode layer 124 along the electrode-photoconductor interface 132 within the second segment 140 is equal to or exceeds the thickness $d_0$ of the electrode layer 124. In particular, as further schematically depicted in FIG. 1, a maximum elevation $h=d_2-d_0$ of the electrode layer 124 along the electrode-photoconductor interface 132 within the second segment 140 with respect to the thickness $d_0$ of the electrode layer 124 may, preferably, exceed the thickness $d_0$ of the electrode layer by 27% or less, more preferred by 17% or less, most preferred by 7% or less. Herein, a length $l_2$ of the second may, preferably, be 65% or less, more preferred 45% or less, most preferred 15% or less, of the thickness $d_0$ of the electrode layer 124.

Further, a thickness $d_3$ of the electrode layer 124 along the electrode-photoconductor interface 132 within the third segment 142 exhibits a continuous and monotonous decrease 144 along the electrode-photoconductor interface 132 within the third segment 142 towards an edge 146 of the electrode layer 124 in a direction towards the photoconductive layer 112, wherein the thickness $d_3$ of the electrode layer 124 at the edge 146 vanishes by arriving at a values which is practically zero. Herein, a length $l_3$ of the third segment may, preferably, be 20% to 230%, more preferred 35% to 170%, most preferred 55% to 145%, of the thickness $d_0$ of the electrode layer 124.

As demonstrated below in FIGS. 3 and 4, the optical sensor 110 having this particular kind of arrangement exhibits a linear current-voltage characteristic according to Ohm's law.

Figure 2:
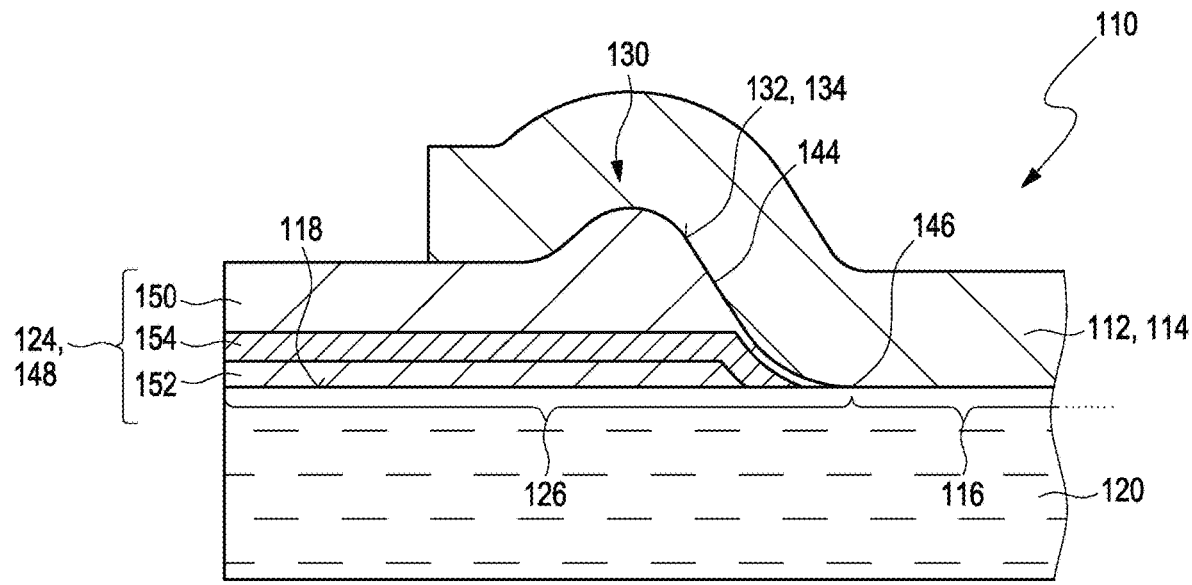
FIG. 2 shows a preferred exemplary embodiment of the electrode layer comprised by an optical detector according to the present invention.

FIG. 2 illustrates a preferred exemplary embodiment of the electrode layer 124 which may be comprised by the optical detector 110 in a sectional side view. In this embodiment, the electrode layer 124 comprises an electrically conducting laminate 148 comprising a charge carrier layer 150, a bonding layer 152, and a barrier layer 154.

Accordingly, the charge carrier layer 150 may comprise a charge carrier agent which may be designed for transporting charge carriers within the electrode layer 124 as well as to and/or from the photoconductive layer 112. As depicted in FIG. 2, the charge carrier layer 150 may, preferably, be adjacent to the photoconductive layer 112, thus, facilitating a transport of the charge carriers to and/or from the adjoining photoconductive layer 112. For this purpose, the charge carrier layer 150 may, preferably, comprise atoms selected from at least one of gold, silver, copper, platinum, rhodium, nickel, tin, lead, zinc, tungsten, aluminum, calcium, gallium, chromium, titanium, manganese, beryllium, magnesium, preferably of gold, silver, copper, platinum, rhodium, titanium, manganese, beryllium, magnesium, nickel, tin.

Further, the bonding layer 152 may be applied to the substrate 120, preferably in a direct manner. Accordingly, the bonding layer 152 may comprise a bonding agent which may be designed for attaching the charge carrier layer 150 to the second portion 126 of the surface 118 of the substrate 120. For this purpose, the bonding layer may, preferably, comprise atoms selected from at least one of titanium, chromium, tin, beryllium, magnesium, silver, zinc, calcium, zirconium, nickel, aluminum. Herein, the thickness of the bonding layer may be 0.1 nm, preferably 0.5 nm, more preferred 1 nm, most preferred 2 nm, to 20 nm, preferably to 16 nm, more preferred to 10 nm, most preferred 7 nm.

Further, the barrier layer 154 may be applied to the bonding layer 152, preferably in a direct manner. Herein, the barrier layer 154 may comprise a barrier agent which may be designed for preventing a direct contact of the bonding agent with the charge carrier layer 150. For this purpose, the barrier layer 154 may, preferably, comprise atoms selected from at least one of nickel, tin, chromium, titanium, manganese, lead, magnesium, preferably of tin, nickel, chromium, magnesium. Herein, the thickness of the barrier layer may be 5 nm, preferably 16 nm, more preferred 27 nm, most preferred 38 nm, to 170 nm, preferably to 140 nm, more preferred to 95 nm, most preferred 83 nm.

As a result of this particular arrangement as illustrated in FIG. 2, the surface 134 of the electrode layer 124 which adjoins the edge portion 130 of the photoconductive layer 112 which partially covers the electrode layer 124 may comprise only a single kind of metal or alloy. Consequently, the electrode-photoconductor interface 132 may be free of both the bonding agent and the barrier agent, thus, contributing to the linear current-voltage characteristic of the optical sensor 110.

FIG. 3 illustrates, in a highly schematic fashion, an exemplary embodiment of an optical detector 200 according to the present invention in a sectional side view which may, preferably, be adapted for use as an infrared detector. However, other embodiments are feasible. The optical detector 200 comprises at least one of the optical sensors 110 as described above in more detail, which may be arranged along an optical axis of the detector 200. Specifically, the optical axis may be an axis of symmetry and/or rotation of the setup of the optical sensor 110. The optical sensor 110 may be located inside a housing of the detector 200. Further, at least one transfer device may be comprised, preferably a refractive lens. An opening in the housing, which may, particularly, be located concentrically with regard to the optical axis may, preferably, define a direction of view of the detector 200.

Further, the optical sensor 110 is designed to generate at least one sensor signal in a manner dependent on an illumination of a sensor region 202 by the light beam 126. Herein, the detector 200 may have a straight beam path or a tilted beam path, an angulated beam path, a branched beam path, a deflected or split beam path or other types of beam paths. Further, the light beam 122 may propagate along each beam path or partial beam path once or repeatedly, unidirectionally or bidirectionally.

According to the FiP effect, the optical sensor 110 may provide a sensor signal which, given the same total power of the illumination, is dependent on a beam cross-section 204 of the light beam 122 within the sensor region 202. However, other kinds of signals may also be feasible. As indicated above, the sensor region 202 comprises at least one of the photoconductive layers 112 having the photoconductive material 114, preferably, a chalcogenide, in particular lead sulfide (PbS), lead selenide (PbSe), or lead sulfoselenide (PbSSe). However, other photoconductive materials 114, in particular other chalcogenides, may be used. As a result of the use of the photoconductive material 114 in the sensor region 202, an electrical conductivity of the sensor region 202, given the same total power of the illumination, depends on the beam cross-section of the light beam 122 in the sensor region 202. Consequently, the resulting sensor signal as provided by the optical sensor 110 upon impingement by the light beam 122 may depend on the electrical conductivity of the photoconductive material 114 in the sensor region 202 and, thus, allows determining the beam cross-section 204 of the light beam 122 in the sensor region 202.

As indicated above, the substrate 120 may be attached, preferably via a thin film of glue, to a circuit carrier device 206, in particular to a printed circuit board (PCB) 208. As further already mentioned above, one or more electrical contacts 210, 210' can be applied to the electrode layer 124 in order to be used for providing electrical connection to an external circuit via contact pads 212, 212' as comprised by the a circuit carrier device 206. For this purpose, wires 214, such as gold wires, beryllium-doped gold wires, aluminum wires, platinum wires, palladium wires, silver wires, or copper wires, may be used as leads for providing the electrical contacts 210, 210' between the corresponding second portion 136 of each of the electrode layers 124 to the contact pads 212, 212' on the circuit carrier device 206. Herein, the wires 214 may be bondable through the cover, in particular, to improve the encapsulation function of the cover and, concurrently, providing stability to the electrical contacts. The direct electrical connection between the wires 214 and the electrode layer 124 may be provided by any known process capable of providing electrical contacts, such as plating, welding, soldering, wire bonding, thermosonic bonding, stitch-bonding, ball-bonding, wedge bonding, compliant bonding, thermocompression bonding, anodic bonding, direct bonding, plasma-activated bonding, eutectic bonding, glass frit bonding, adhesive bonding, transient liquid phase diffusion bonding, surface activated bonding, tape-automated bonding, or depositing electrically highly conductive substances at the contact zones. In order to allow sufficient electrical conductivity through the wires 214 while, concurrently, providing an sufficient mechanical stability of the wires 214, the wires 214 may, preferably, comprise at least one electrode material selected from the group consisting of the metals Ag, Cu, Pt, Al, Mo or Au, an alloy comprising at least one of the mentioned metals, as well as graphene. However, other kinds of electrode materials may also be feasible.

Further, the optical sensor 110 according to the present invention may comprise a cover 216, wherein the cover 216 may, preferably fully, cover accessible surfaces of the photoconductive layer 112, of the electrode layer 124 and of the substrate 120. As already described above, the cover 216 may, thus, be adapted for providing an encapsulation not only for the photoconductive material 114 but also for the electrode material and the substrate material, in particular as an hermetic package, in order to avoid a degradation of the optical sensor 110 or a partition thereof, in particular of the photoconductive material 114, by external influence, such as humidity and/or oxygen. Herein, the cover 116 may be an amorphous cover comprising at least one metal-containing compound, particularly selected from the group consisting of Al, Zr, Hf, Ti, Ta, Mn, Mo, and W, wherein the metals Al, Ti, Zr, and Hf are especially preferred. However, other kinds of metals may also be feasible. Further, the metal-containing compound may be selected from a group comprising an oxide, a hydroxide, a chalcogenide, a pnictide, a carbide, or a combination thereof. In a particularly preferred embodiment, the metal-containing compound may, preferably, comprise at least one oxide of Al, at least one hydroxide of Al, or a combination thereof, which may also be expressed by the formula $AlO_x(OH)_y$, with $0 \leq x \leq 1.5$ and $0 \leq y \leq 1.5$, wherein $x+y=1.5$. In this particularly preferred embodiment, the cover 216 may exhibit a thickness of 10 nm to 600 nm, preferably of 20 nm to 200 nm, more preferred of 40 nm to 120 nm, most preferred of 50 to 95 nm. This range of thickness may, in particular, reflect the amount of metal-containing compounds within the cover 216 that may be advantageous to achieve the desired encapsulation for the photoconductive material 114. Further, the cover 216 may be a conformal cover with respect to the adjacent surfaces of the photoconductive material 114. As defined above, the thickness of the conformal cover may, thus, follow the corresponding surface 118 of the photoconductive material 114 within a deviation of ±50 nm, preferably of ±20 nm, mostly preferred of ±10 nm, wherein the deviation may occur for at least 90%, preferably for at least 95%, mostly preferred for at least 99%, of a surface 122 of the cover 116, hereby leaving aside any contamination or imperfection that may be present on the surface 122 of the cover 116.

Via further electrical leads 218, 218' which may be bonded to the contact pads 214, 214' on the circuit carrier device 206, the sensor signal may be transmitted to an evaluation device 220, which is, generally, designed to generate at least one item of information by evaluating the sensor signal of the optical sensor 110. For this purpose, the evaluation device 220 may comprise one or more electronic devices and/or one or more software components, in order to evaluate the sensor signals. Generally, the evaluation device 220 may be part of a data processing device 222 and/or may comprise one or more data processing devices 222. The evaluation device 220 may be fully or partially integrated into the housing and/or may fully or partially be embodied as a separate device which is electrically connected in a wireless or wire-bound fashion to the optical sensor 110. The evaluation device 220 may further comprise one or more additional components, such as one or more electronic hardware components and/or one or more software components, such as one or more measurement units and/or one or more evaluation units and/or one or more controlling units (not depicted here).

Figure 4:
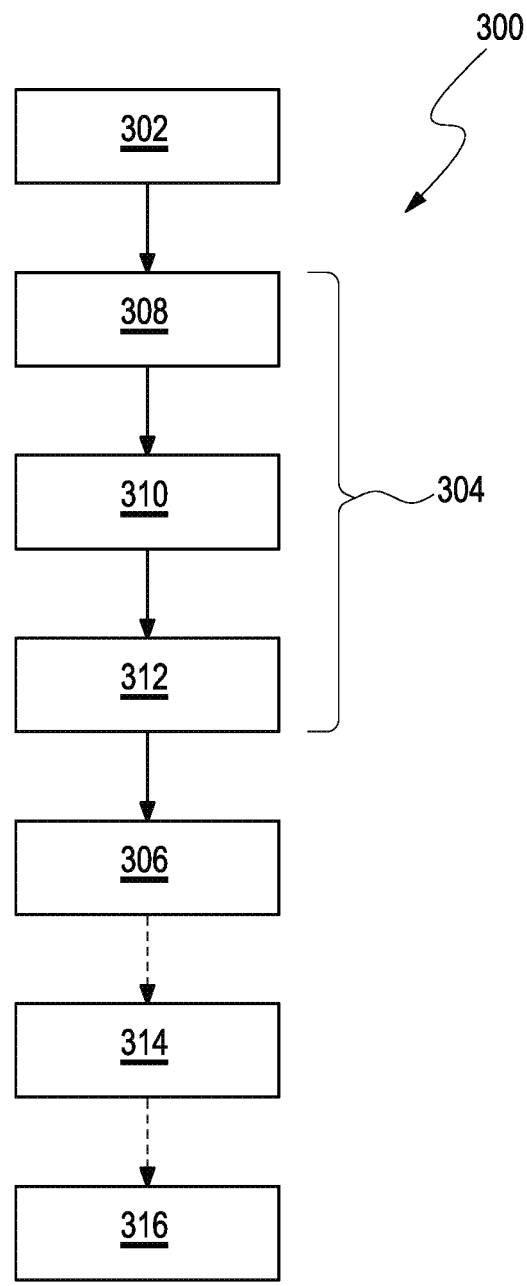
FIG. 4 shows a preferred exemplary embodiment of a method for manufacturing an optical sensor according to the present invention.

FIG. 4 illustrates, in a highly schematic fashion, an exemplary embodiment of a method 300 for manufacturing the optical sensor 110 according to the present invention.

According to a providing step 302, the substrate 120 is provided, preferably attached to a circuit carrier device 206.

Further according to a first applying step 304, the at least one electrode layer 124 is applied to the second portion 126 of the surface 118 of the substrate 120 in a manner that the electrode layer 124 exhibits the preferably constant thickness $d_0$ apart from the first edge portion 128 of the electrode layer 124.

In a further applying step 306, the photoconductive layer 112 having the at least one photoconductive material 114 is applied to the first portion 116 of the surface 118 of the substrate 120 in a manner that also the first edge portion 128 of the electrode layer 124 is covered by an edge portion 130 of the photoconductive layer 112, thereby forming the electrode-photoconductor interface 132 at the surface 134 of the electrode layer 124.

Herein, the electrode-photoconductor interface 132 is formed in a fashion that the electrode-photoconductor interface 134 comprises a first segment 138, a second segment 140, and a third segment 142, wherein the thickness $d_1$ of the electrode layer 124 along the electrode-photoconductor interface 132 within the first segment 138 equals the thickness $d_0$ of the electrode layer;

wherein the thickness $d_2$ of the electrode layer 124 along the electrode-photoconductor interface 132 within the second segment 140 is equal to or exceeds the thickness $d_0$ of the electrode layer 124; and wherein the thickness $d_3$ of the electrode layer 124 along the electrode-photoconductor interface 132 within the third segment 142 exhibits a continuous and monotonous decrease 144 along the electrode-photoconductor interface 132 within the third segment 142 towards the edge 146 of the electrode layer 124.

Herein, electrode layer 124 may, preferably, be provided during the first applying step 304 in the form of the electrically conducting laminate 148 as schematically depicted in FIG. 2 above, wherein the laminate 148 comprises the charge carrier layer 150, the bonding layer 152, and the barrier layer 154.

For a purpose of providing the electrically conducting laminate 148, in a bonding step 308, the bonding layer 152 may be directly applied onto the second portion 126 of the surface 118 of the substrate 120, wherein a bonding agent which is designed for attaching the charge carrier layer 150 to the substrate 120 may be comprised by the bonding layer 152.

In a further barrier step 310, the barrier layer 154 may be directly applied onto the bonding layer 152, wherein a barrier agent which is designed for preventing a direct contact of the bonding agent with the charge carrier layer 150 may be comprised by the barrier layer 154.

In a further applying step 312, the charge carrier layer 150 may be directly be applied onto the barrier layer 154, wherein a charge carrier agent being which is designed for transporting charge carriers to and/or from the photoconductive layer 112 may be comprised by the charge carrier layer 150.

For further details concerning the electrically conducting laminate 148 which may, preferably be comprised by the electrode layer 124, reference may be made to the description of FIG. 2.

Further, the method 300 for manufacturing the optical sensor 110 in accordance with the present invention may comprise additional steps, such as a connecting step 314, in which the electrical contacts 210, 210' to contact pads 212, 212' on the circuit carrier board 206 as well as the further leads 218, 218' from the contact pads 212, 212' to the evaluation device 220 can be provided, or a covering step 316, in which the cover 216 can be provided. In addition, further manufacturing steps may also be conceivable.

Based on this method 300, a optical sensor 110 comprising a PbS photoconductor in the photoconductive layer 112 and an electrode layer 124 being well-shaped according to the requirements of the present invention has been prepared and shows an Ohmic behavior. Herein, crystalline voids which could be observed in electron microscopy images located between the electrode layer 124 and the photoconductor layer 112 at the electrode-photoconductor interface 132 do not influence the resistive behavior of the optical sensor 110.

Figure 5:
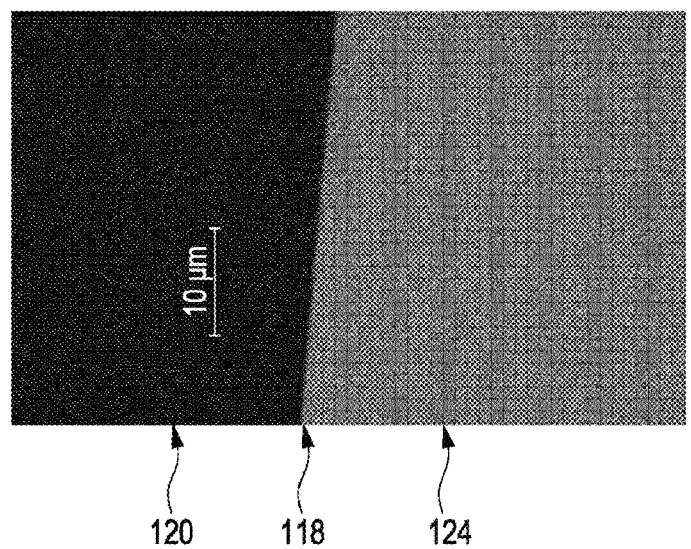
FIGS. 5A to 5C show high-resolution light microscopy image of the electrode-surface interface in three different samples A, B and C of an optical sensor according to the present invention (Sample A) and for comparison (Samples B and C)
Figure 5:
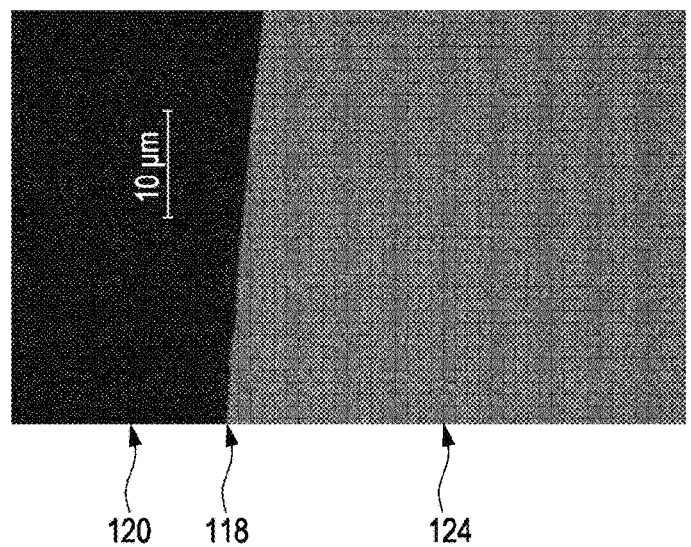
Figure 5:
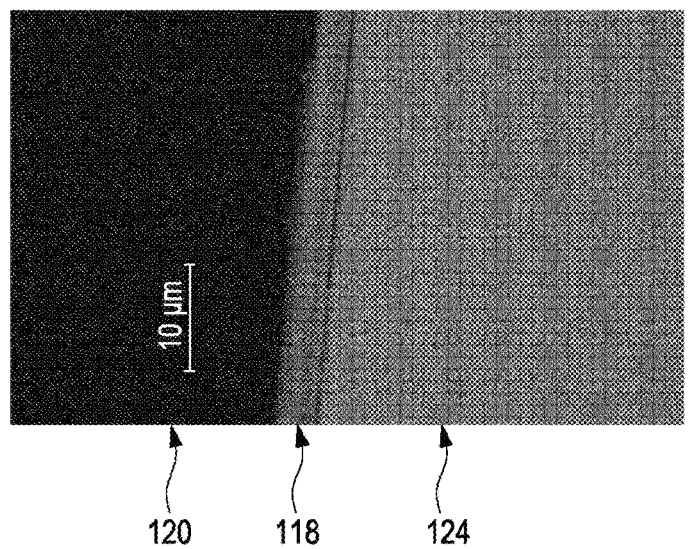

Each of FIGS. 5A to 5C shows a high-resolution light microscopy image of the electrode-surface interface in three different samples A, B and C of an optical sensor. The bar in each image indicates a distance of 10 μm. As can be seen from these images and as described below in more detail, only sample A has been prepared according to the present invention.

FIG. 5A shows a light microscopy image of the electrode layer 124 on the surface 118 of the substrate 120 in the sample A in a top view. Herein, the electrode layer 124 at the right comprises gold which assumes a nicely shaped edge with respect to the glass substrate 120 at the left. No elevations of the electrode layer 124 are visible.

FIG. 5B shows a further light microscopy image of the electrode layer 124 on the surface 118 of the substrate 120 in the sample B in a top view. Again, the electrode layer 124 at the right comprises gold while the glass substrate 120 is visible at the left. Herein, elevation of the electrode layer 124 is visible in form of a darker line in the electrode layer 124 about 5 μm from the edge. The unsteady edge is a result of the electrode cross section which does not behave like a monotonous function.

FIG. 5C shows a further light microscopy image of the electrode layer 124 on the surface 118 of the substrate 120 in the sample C in a top view. Again, the electrode layer 124 at the right comprises gold while the glass substrate 120 is visible at the left. Herein, elevation is, again, visible as several dark lines in the electrode layer 124 about 2-5 μm from the edge. The unsteady edge, again, results from the electrode cross section which does not behave like a monotonous function.

Figure 6:
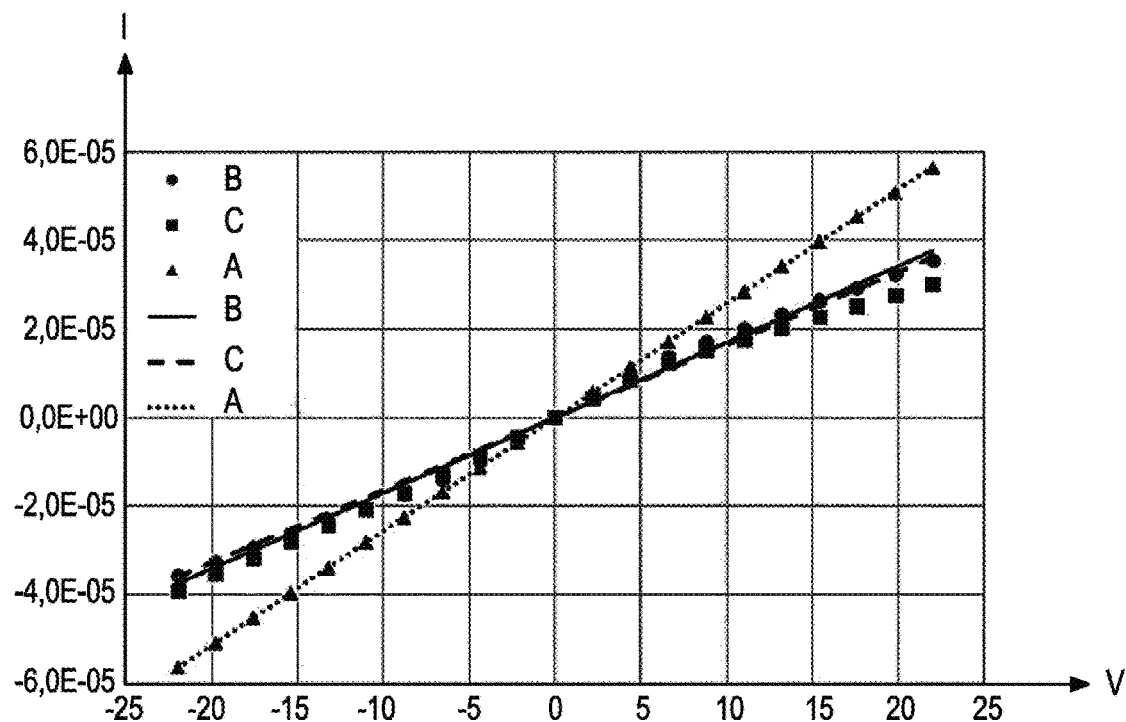
FIGS. 6A and 6B show experimentally measured current-voltage characteristics of the samples A, B, and C according to FIGS. 5A to 5C (FIG. 6A) and corresponding deviations from a linear behavior (FIG. 6B).
Figure 6:
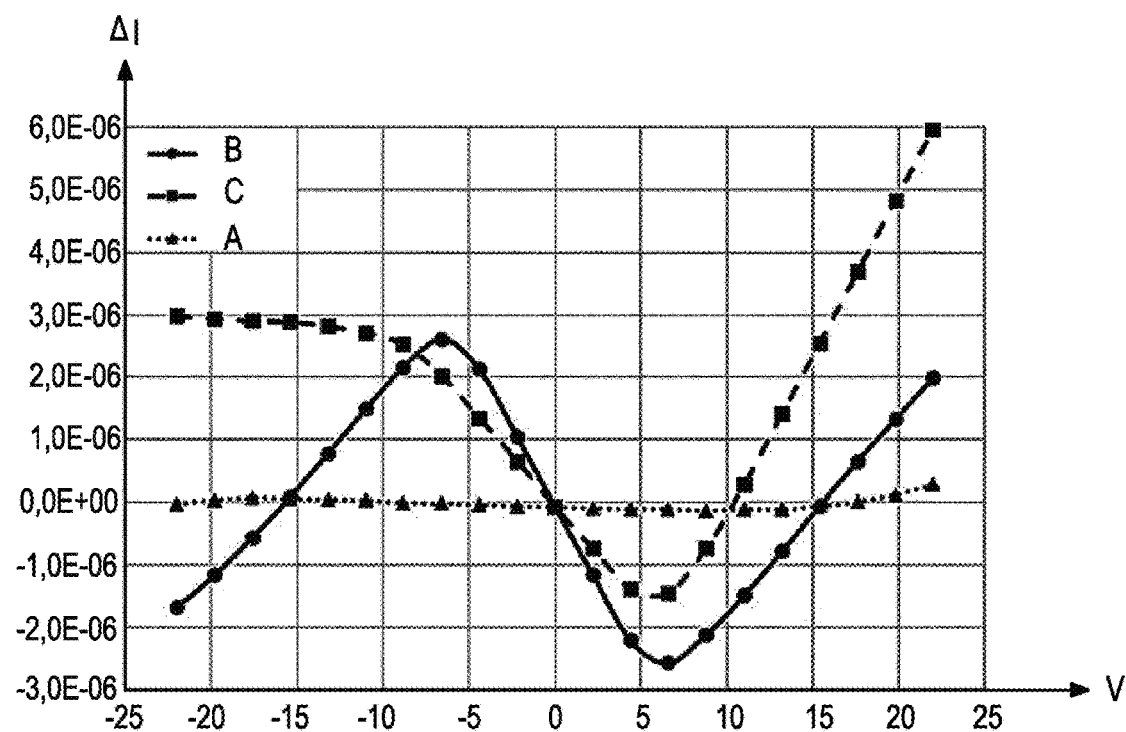

FIG. 6A shows experimentally measured current-voltage characteristics in the dark of the samples A, B, and C as described in FIGS. 5A to 5C. Herein, the measured values of the current I and the voltage V have, in addition, been fitted by corresponding linear regression curves as follows, wherein the term $R^2$ denotes a standard deviation, thus, providing an estimation for the desired linearity:

Sample A: I=0.0000025686·U; $R^2$=0.9999921
Sample B: I=0.0000017042·U; $R^2$=0.9953361
Sample B: I=0.0000016385·U; $R^2$=0.9852617

As a result, Sample A provides a significant linearity in the resistive behavior, specifically in comparison to Samples B and C. This observation is confirmed by FIG. 6B which shows corresponding current deviations Δ/from the linear current-voltage characteristic in a different representation in which the current deviation Δ/is calculated as a difference between a current determined by the linear regression and the measured current I.

LIST OF REFERENCE NUMBERS 110 sensor
112 photoconductive layer
114 photoconductive material
116 first portion of substrate
118 surface of substrate
120 substrate
122 light beam
124 electrode layer
126 second portion of substrate
128 first edge portion of electrode layer
130 edge portion of photoconductive layer
132 electrode-photoconductor interface
134 surface of electrode layer
136 second edge portion of electrode layer
138 first segment
140 second segment
142 third segment
144 decrease
146 edge of electrode layer
148 laminate
150 charge carrier layer
152 bonding layer
154 barrier layer
200 detector
202 sensor region
204 beam cross-section
206 circuit carrier device
208 printed circuit board (PCB)
210, 210' electrical contact
212, 212' contact pad
214 wire
216 cover
218, 218' lead
220 evaluation device
222 processing device
300 method for manufacturing the optical sensor
302 providing step
304 first applying step
306 further applying step
308 bonding step
310 barrier step
312 further applying step
314 connecting step
316 covering step

The invention claimed is:

1. An optical sensor (110), comprising
a substrate (120);
a photoconductive layer (112) applied to a first portion (116) of a surface (118) of the substrate (120), the photoconductive layer (112) having at least one photoconductive material (124); and
at least one electrode layer (124) applied to a second portion (126) of the surface (118) of the substrate (120), wherein the electrode layer (124), apart from a first edge portion (128) of the electrode layer (124), exhibits a thickness $d_0$, wherein the first edge portion (128) of the electrode layer (124) is covered by an edge portion (130) of the photoconductive layer (112) in a manner that an electrode-photoconductor interface (132) is formed at a surface (134) of the electrode layer (124),
wherein the electrode-photoconductor interface (132) comprises a first segment (138), a second segment (140), and a third segment (142);
wherein a thickness $d_1$ of the electrode layer (124) along the electrode-photoconductor interface (132) within the first segment (138) equals the thickness $d_0$ of the electrode layer (124);
wherein a thickness $d_2$ of the electrode layer (124) along the electrode-photoconductor interface (132) within the second segment (140) is equal to or exceeds the thickness $d_0$ of the electrode layer (124); and
wherein a thickness $d_3$ of the electrode layer (124) along the electrode-photoconductor interface (132) within the third segment (142) decreases continuously and monotonically along the electrode-photoconductor interface (132) within the third segment (142) towards an edge of the electrode layer (146).

2. The optical sensor (110) according to claim 1, wherein a maximum elevation $h=d_2-d_0$ of the electrode layer (124) along the electrode-photoconductor interface (132) within the second segment (140) with respect to the thickness $d_0$ of the electrode layer (124) exceeds the thickness do of the electrode layer (124) by 27% or less.

3. The optical sensor (110) according to claim 1, wherein a length $l_2$ of the second segment (140) is 65% or less of the thickness $d_0$ of the electrode layer (124).

4. The optical sensor (110) according to claim 1, wherein a length $l_3$ of the third segment (142) is 20% to 230% of the thickness do of the electrode layer (124).

5. The optical sensor (110) according to claim 1, wherein the electrode layer (124) is an electrically conducting laminate (148) comprising
a charge carrier layer (150) directly adjoining the photoconductive layer (112), wherein the charge carrier layer (150) comprises a charge carrier agent being designed for transporting charge carriers within the electrode layer (124) and to and/or from the photoconductive layer (112);
a bonding layer (152) directly applied to the substrate (120), wherein the bonding layer (152) comprises a bonding agent being designed for attaching the charge carrier layer (150) to the second portion (126) of the surface (118) of the substrate (120); and
a barrier layer (154) directly applied to the bonding layer (152), wherein the barrier layer (154) comprises a barrier agent being designed for preventing a direct contact of the bonding agent with the charge carrier layer (150).

6. The optical sensor (110) according to claim 5, wherein the charge carrier layer (150) only comprises the charge carrier agent at the electrode-photoconductor interface (132).

7. The optical sensor (110) according to claim 5, wherein the charge carrier agent is selected from the group consisting of atoms of gold, wherein the bonding agent is selected from the group consisting of atoms of titanium, and wherein the barrier agent is selected from the group consisting of atoms of nickel tin, chromium, titanium, manganese, lead, magnesium.

8. The optical sensor (110) according to claim 1, wherein the photoconductive material (114) is selected from the group consisting of lead sulfide (PbS), lead selenide (PbSe), lead telluride (PbTe), cadmium telluride (CdTe), indium phosphide (InP), cadmium sulfide (CdS), cadmium selenide (CdSe), indium antimonide (InSb), mercury cadmium telluride (HgCdTe; MCT), copper indium sulfide (CIS), copper indium gallium selenide (CIGS), zinc sulfide (ZnS), zinc selenide (ZnSe), copper zinc tin sulfide (CZTS), a solid solution and a doped variant thereof.

9. The optical sensor (110) according to claim 1, further comprising a cover (216) which covers accessible surfaces of at least one of the photoconductive layer (112), the at least one electrode layer (132), and the substrate (120), wherein the cover (216) is an amorphous cover comprising at least one metal-containing compound.

10. The optical sensor (110) according to claim 1, wherein the electrode layer (124) comprises a second edge portion (136) not being covered by the photoconductive layer (112), wherein the second edge portion (136) is designated for providing electrical connection to the electrode layer (124).

11. The optical sensor (110) according to claim 1, wherein the substrate (120) is directly or indirectly attached to a circuit carrier device (206).

12. The optical sensor (110) according to claim 11, wherein direct or indirect electrical connection is provided between the second edge portion (126) of the electrode layer (124) and the circuit carrier device (206).

13. A detector (150) for optical detection, comprising:
at least one optical sensor (110) according to claim 1, the optical sensor (110) comprising at least one sensor region (202), wherein the optical sensor (110) is designed to generate at least one sensor signal in a manner dependent on an illumination of the sensor region (202) by a light beam (122); and
at least one evaluation device (220), wherein the evaluation device (220) is designed to generate at least one item of information with respect to optical radiation provided by the light beam (122) by evaluating the sensor signal of the optical sensor (110).

14. A method (300) for manufacturing an optical sensor (100), the method (300) comprising the following steps:
a) providing a substrate (120);
b) applying at least one electrode layer (124) to a second portion (126) of the surface (118) of the substrate (120) in a manner that the electrode layer (124), apart from a first edge portion (128) of the electrode layer (124), exhibits a thickness $d_0$; and
c) further applying a photoconductive layer (112), the photoconductive layer (112) having at least one photoconductive material (114), to a first portion (116) of the surface (118) of the substrate (120) in a manner that also the first edge portion (128) of the electrode layer (124) is covered by an edge portion (130) of the photoconductive layer (112), whereby an electrode-photoconductor interface (132) is formed at a surface (134) of the electrode layer (124),
wherein the electrode-photoconductor interface (132) is formed in a fashion that the electrode-photoconductor interface (132) comprises a first segment (138), a second segment (140), and a third segment (142);
wherein a thickness $d_1$ of the electrode layer (124) along the electrode-photoconductor interface (132) within the first segment (138) equals the thickness $d_0$ of the electrode layer (124);
wherein a thickness $d_2$ of the electrode layer (124) along the electrode-photoconductor interface (132) within the second segment (140) is equal to or exceeds the thickness $d_0$ of the electrode layer (124); and
wherein a thickness $d_3$ of the electrode layer (124) along the electrode-photoconductor interface (132) within the third segment (142) decreases continuously and monotonically along the electrode-photoconductor interface (132) within the third segment (142) towards an edge (146) of the electrode layer (124).

15. The method (300) according to claim 14, wherein the electrode layer (124) is formed as an electrically conducting laminate (148) by
applying a bonding layer (152) directly onto the second portion (126) of the surface (118) of the substrate (120), wherein the bonding layer (152) comprises a bonding agent being designed for attaching a charge carrier layer (150) to the substrate (120);
further applying a barrier layer (154) directly onto the bonding layer (152), wherein the barrier layer (154) comprises a barrier agent being designed for preventing a direct contact of the bonding agent with the charge carrier layer (150); and
further applying the charge carrier layer (150) directly onto the barrier layer (154), wherein the charge carrier layer (150) comprises a charge carrier agent being designed for transporting charge carriers to and/or from the photoconductive layer (112).

16. The optical sensor (110) according to claim 5, wherein the charge carrier agent is selected from the group consisting of atoms of gold, wherein the bonding agent is selected from the group consisting of atoms of titanium, and wherein the barrier agent is selected from the group consisting of atoms of tin, nickel, chromium, and magnesium.

* * * * *